(12) United States Patent
Kashiwagi et al.

(10) Patent No.: US 6,239,044 B1
(45) Date of Patent: May 29, 2001

(54) APPARATUS FOR FORMING SILICON OXIDE FILM AND METHOD OF FORMING SILICON OXIDE FILM

(75) Inventors: Akihide Kashiwagi; Toyotaka Kataoka; Toshihiko Suzuki, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/322,020

(22) Filed: May 28, 1999

(30) Foreign Application Priority Data

Jun. 8, 1998 (JP) .................................. 10-159606

(51) Int. Cl.⁷ ........................... H01L 21/31; H01L 21/469
(52) U.S. Cl. ............................... 438/787; 438/789
(58) Field of Search ...................... 438/240, 758, 438/787, 624, 773, 774, 789; 216/59, 67, 69; 134/1, 2, 18, 22

(56) References Cited

U.S. PATENT DOCUMENTS

| | | | |
|---|---|---|---|
| 5,885,361 | * | 3/1999 | Kikuchi et al. ........................ 134/1.1 |
| 6,010,969 | * | 1/2000 | Vaartstra ............................... 438/758 |
| 6,063,300 | * | 5/2000 | Suzuki et al. .......................... 216/59 |

* cited by examiner

Primary Examiner—David Nelms
Assistant Examiner—Phuc T. Dang
(74) Attorney, Agent, or Firm—Ronald P. Kananen; Rader, Fishman & Grauer

(57) ABSTRACT

An apparatus for forming a silicon oxide film which has a process chamber and is for thermally oxidizing a surface of a silicon layer by introducing water vapor into the process chamber, and which further has dew-formation prevention/evaporation means for preventing dew formation in the process chamber and/or evaporating dew in the process chamber.

21 Claims, 25 Drawing Sheets

[STEP-110] TRANSFER OF SEMICONDUCTOR SUBSTRATES INTO SUBSTRATE TRANSFER PORTION

[STEP-120] OPENING OF SHUTTER 15

[STEP-140] INTRODUCTION OF WATER VAPOR INTO PROCESS CHAMBER

[STEP-150] INTRODUCTION OF INERT GAS INTO PROCESS CHAMBER

[STEP-440] INTRODUCTION OF WATER VAPOR INTO PROCESS CHAMBER

[STEP-450] RAISING OF AMBIENT TEMPERATURE IN PROCESS CHAMBER

[STEP-460] INTRODUCTION OF WATER VAPOR INTO PROCESS CHAMBER

[STEP-470] INTRODUCTION OF INERT GAS INTO PROCESS CHAMBER

[STEP-510] TRANSFER OF SEMICONDUCTOR SUBSTRATES INTO SUBSTRATE TRANSFER PORTION

[STEP-520] OPENING OF SHUTTER 15

[STEP-540] REPLACEMENT OF AMBIENT IN PROCESS CHAMBER WITH INERT GAS

[STEP-550] TRANSFER OF SEMICONDUCTOR SUBSTRATES INTO SUBSTRATE TRANSFER PORTION

[STEP-20] TRANSFER OF SEMICONDUCTOR SUBSTRATES INTO SUBSTRATE TRANSFER PORTION

[STEP-30] OPENING OF SHUTTER 15

TRANSFER OF SEMICONDUCTOR SUBSTRATES INTO PROCESS CHAMBER $N_2$ GAS ATMOSPHERE, AT 700 ~ 750 °C

[STEP-40] RAISING OF AMBIENT TEMPERATURE IN PROCESS CHAMBER $N_2$ GAS ATMOSPHERE, AT 800 ~ 900 °C

[STEP-40] CONTINUED
INTRODUCTION OF WATER VAPOR
INTO PROCESS CHAMBER

[STEP-50] INTRODUCTION OF INERT GAS
INTO PROCESS CHAMBER AND
REDUCTION OF AMBIENT TEMPERATURE

APPARATUS FOR FORMING SILICON OXIDE FILM AND METHOD OF FORMING SILICON OXIDE FILM

BACKGROUND OF THE INVENTION AND RELATED ART STATEMENT

The present invention relates to an apparatus for forming a silicon oxide film and a method of forming a silicon oxide film.

For example, in production of a MOS type semiconductor device, it is required to form a gate oxide film composed of a silicon oxide film on a surface of a silicon semiconductor substrate. In production of a thin film transistor (TFT), it is also required to form a gate oxide film composed of a silicon oxide film on a surface of a silicon layer formed on an insulation substrate. It can safely be said that reliability of the semiconductor devices depends upon these silicon oxide films. The silicon oxide films are therefore constantly required to have high dielectric breakdown durability and long-term reliability.

With a decrease in thickness of a gate oxide film and an increase in diameter of a substrate, an apparatus for forming a silicon oxide film has been being converted from a horizontal-type apparatus in which a process chamber (oxidation chamber) formed of quartz extends in a horizontal direction to a vertical-type apparatus in which a process chamber extends in a vertical direction. The reason therefor is as follows. Not only the vertical-type apparatus for forming a silicon oxide film can easily cope with an increase in a diameter of a substrate as compared with the horizontal-type apparatus, but also the vertical-type apparatus can serve to decrease formation of a layer of silicon oxide (to be referred to as "natural oxide" hereinafter) caused by atmosphere taken into the process chamber of the vertical-type apparatus during transfer of silicon semiconductor substrates into the process chamber. However, even the use of the vertical-type apparatus for forming a silicon oxide film results in the formation of a natural oxide having a thickness of approximately 2 nm on the surface of the silicon semiconductor substrate. The natural oxide contains a large amount of impurities derived from atmosphere, and the presence of the natural oxide is not at all negligible when a gate oxide is decreased in thickness. There have been therefore proposed methods for preventing the formation of the natural oxide to the lowest level possible, such as (1) a method in which a nitrogen gas atmosphere is formed in a substrate transfer portion provided in a vertical-type apparatus by flowing a large volume of nitrogen gas (nitrogen gas purge method), and (2) a method in which a substrate transfer portion is vacuumed and then nitrogen gas or the like is introduced into the substrate transfer portion to discharge atmosphere (vacuum loadlock method).

Thereafter, in a state where an inert gas atmosphere is formed in the process chamber (oxidation chamber), silicon semiconductor substrates are brought into the process chamber (oxidation chamber). Then, an atmosphere of the process chamber (oxidation chamber) is replaced with an oxidative atmosphere and the silicon semiconductor substrates are thermally oxidized to form gate oxide films. For the formation of the gate oxide film, there is generally employed a method in which high-purity water vapor is introduced into the process chamber maintained at a high temperature to thermally oxidize the surface of the silicon semiconductor substrate (wet oxidation method). In this method, a gate oxide film having high electric reliability can be obtained as compared with a method in which the surface of the silicon semiconductor substrate is oxidized with high-purity dry oxygen gas (dry oxidation method). Included in the above wet oxidation method is a pyrogenic oxidation method (also called "hydrogen gas combustion oxidation method or wet oxidation") in which hydrogen gas is mixed with oxygen gas at a high temperature and is combusted and the so-generated water vapor is used. The pyrogenic oxidation method is widely used. In the pyrogenic oxidation method, generally, oxygen gas is supplied into a combustion chamber which is disposed outside the process chamber (oxidation chamber) and which interior is maintained at 700 to 900° C., and then hydrogen gas is supplied into the combustion chamber to combust the hydrogen gas at a high temperature. The so-obtained water vapor is used as oxidizing species.

FIG. 21 shows a schematic view of a vertical-type apparatus for forming a silicon oxide film by the pyrogenic oxidation method. The vertical-type apparatus comprises a double-tubular structured process chamber 10 made of quartz and held perpendicularly, a water vapor inlet port 12 for introducing water vapor and the like into the process chamber 10, a gas exhaust portion 13 for exhausting the gas from the process chamber 10, a heater 14 for maintaining the interior of the process chamber 10 at a predetermined ambient temperature through a cylindrical heat equalizer tube 16 made of SiC, a substrate transfer portion 20, a gas introducing portion 21 for introducing nitrogen gas into the substrate transfer portion 20, a gas exhaust portion 22 for exhausting the gas from the substrate transfer portion 20, a shutter 15 for partitioning the process chamber 10 and the substrate transfer portion 20, and an elevator unit 23 for bringing silicon semiconductor substrates into and out of the process chamber 10.

A base portion 26 is attached to the elevator unit 23, and a heat insulation member 25 is disposed on the base portion 26. Further, onto the heat insulation member 25 is attached a substrate receiving member 24 made of quartz or SiC for receiving silicon semiconductor substrates therein. A sealing member 27 formed of, for example, an "O-ring" is attached to a marginal portion of the upper surface of the base portion 26, and when the substrate receiving member 24 is brought into the process chamber 10, the lower portion of the process chamber 10 is sealed with the base portion 26 (see FIG. 22). The base portion 26 is structured so as to flow coolant inside.

The heat insulation member 25 is also called a heat-retaining cylinder or a heat barrier, and generally, it is a hollow and cylindrical member having its top and bottom surfaces closed and being formed of quartz, and it has a structure in which the hollow portion is filled with glass fiber. Further, a piping 17 for flowing coolant is disposed outside the process chamber 10 and near the heat insulation member 25. In the above structure, damage of the sealing member 27 caused by radiation heat directly conducted to the base portion 26 in the process chamber 10, can be prevented and malfunction of the elevator unit 23 can be reliably prevented.

Hydrogen gas supplied to a combustion chamber 30 is mixed with oxygen gas at a high temperature and combusted in the combustion chamber 30 to generate water vapor. The water vapor is introduced into the process chamber 10 through a piping 31, a gas flow passage 11 and a water vapor inlet port 12. The gas flow passage 11 corresponds to a space between an inner wall and an outer wall of the double-tubular structured process chamber 10.

A conventional method of forming a silicon oxide film with a conventional apparatus having the above structure will be outlined with reference to FIGS. 23 to 25 hereinafter.

[Step-10]

First, nitrogen gas is introduced into the process chamber 10 through a piping 32, the combustion chamber 30, the piping 31, the gas flow passage 11 and the water vapor inlet port 12 to form a nitrogen atmosphere in the process chamber 10, and the ambient temperature in the process chamber 10 is maintained at 700 to 750° C. with the heater 14 through the heat equalizer tube 16. The purpose in maintaining the ambient temperature in the process chamber 10 at the above temperature range is to decrease thermal shock which silicone semiconductor substrates 50 suffer when the silicon semiconductor substrates 50 are transferred into the process chamber 10. In this state, the shutter 15 is kept closed. The substrate transfer portion 20 is in a state where it is open to atmosphere. Further, the piping 17 has coolant flowing. [Step-20]

Silicon semiconductor substrates 50 are transferred into the substrate transfer portion 20, and placed in the substrate receiving member 24. After the transfer of the silicon semiconductor substrates 50 into the substrate transfer portion 20 is completed, a door (not shown) is closed. Then, nitrogen gas is introduced into the substrate transfer portion 20 through the gas introducing portion 21 and is exhausted through the gas exhaust portion 22, to form a nitrogen gas atmosphere in the substrate transfer portion 20 (see FIG. 23A). The base portion 26 has coolant flowing inside. [Step-30]

When a sufficient nitrogen gas atmosphere is formed in the substrate transfer portion 20, the shutter 15 is opened (see FIG. 23B), and the elevator unit 23 is actuated to elevate the substrate receiving member 24 approximately at a rate of 50 mm/minute, whereby the silicon semiconductor substrates 50 are transferred into the process chamber 10 (see FIG. 24A). When the elevator unit 23 reaches its uppermost position, the sealing member 27 comes into contact with the bottom of the process chamber 10, and the process chamber 10 is closed with the base portion 26, whereby the process chamber 10 and the substrate transfer portion 20 are no longer communicated with each other (see FIG. 22). [Step-40]

Then, after the ambient temperature in the process chamber 10 is fully stabilized, the ambient temperature is increased up to 800 to 900° C. (see FIG. 24B). Oxygen gas and hydrogen gas are supplied to the combustion chamber 30 through the pipings 32 and 33, and the hydrogen gas is mixed with the oxygen gas at a high temperature and combusted in the combustion chamber 30 to generate water vapor. The water vapor is introduced into the process chamber 10 through the piping 31, the gas flow passage 11 and the water vapor inlet port 12, and is exhausted through the gas exhaust portion 13 (see FIG. 25A), whereby a silicon oxide film is formed on the surface of each silicon semiconductor substrate 50. The temperature in the combustion chamber 30 is maintained at 700 to 900° C., for example, with a heater (not shown). [Step-50]

After the silicon oxide films having a predetermined thickness are formed, the supply of the water vapor into the process chamber 10 is terminated, and an inert gas atmosphere such as a nitrogen gas atmosphere is formed in the process chamber 10. Then, the ambient temperature in the process chamber 10 is decreased to 700 to 750° C. for decreasing thermal shock on the silicon semiconductor substrates 50 (see FIG. 25B). Then, after the ambient temperature in the process chamber 10 is stabilized, the elevator unit 23 is actuated to lower the substrate receiving member 24, and the silicon semiconductor substrates 50 are transferred out of the substrate transfer portion 20.

Since coolant is continuously flowed in the piping 17 and further since coolant is continuously flowed inside the base portion 26, a large temperature gradient is caused between the ambient temperature in a process chamber area where the substrate receiving member 24 is positioned and the heat insulation member 25 when the ambient temperature in the process chamber 10 is increased, for example, to 850° C. in Step-40, and the heat insulation member 25 has a surface (outer surface) temperature of 150 to 200° C. or lower although it differs depending upon an apparatus for forming a silicon oxide film.

In the conventional method of forming a silicon oxide film, the ambient temperature in the process chamber 10 is decreased to 700 to 750° C. and then the silicon semiconductor substrates 50 are transferred out of the process chamber 10 in Step-50. Therefore, even if dew (water drops) is formed on the surface of the heat insulation member 25 in the process of forming a silicon oxide film, the dew on the heat insulation member 25 is evaporated since the process chamber 10 is maintained to have an inert gas atmosphere at 700 to 750° C. for a certain period of time in Step-50.

In recent years, the thickness of a gate oxide film is decreased for higher integration of an LSI, and with a decrease in the above thickness, the thermal oxidation temperature of the silicon semiconductor substrates is decreased. That is because the time period for the oxidation needs to be extremely decreased or shortened at a conventional thermal oxidation temperature of 800 to 900° C.

Meanwhile, it has come to be known that when the thermal oxidation temperature is set at a low temperature (for example, 700 to 750° C. or lower), the heat insulation member 25 has a surface temperature of less than 100° C. so that dew (water drops) is formed on the surface of the heat insulation member 25 in the step of forming a silicon oxide film. When the silicon semiconductor substrates 50 are transferred out of the process chamber 10 with the dew on the surface of the heat insulation member 25, a metal portion or a metal member of the elevator unit 23 may be corroded. When the metal portion or the metal member is corroded, not only the elevator unit 23 malfunctions, but also a corroded portion can be a source which gives metal impurities. When metal impurities are therefore included in the process chamber 10, characteristics of the silicon oxide films are deteriorated. Further, since the silicon semiconductor substrates 50 have a temperature of hundreds degree C. (°C.) immediately after they are transferred to the substrate transfer portion 20, the dew on the surface of the heat insulation member 25 is evaporated to generate water vapor. When the water vapor comes into contact with the silicon semiconductor substrates 50, the silicon semiconductor substrates 50 suffer stains similar to water marks on their surfaces, which results in in-plane non-uniformity of the silicon oxide films.

OBJECT AND SUMMARY OF THE INVENTION

It is therefore an object of the present invention to provide an apparatus for forming a silicon oxide film and a method of forming a silicon oxide film, in which a metal portion of the apparatus is not corroded with water, and which are free from the problem of in-plane non-uniformity of the silicon oxide film caused by stains similar to water marks on the surface of the silicon semiconductor substrate.

The apparatus for forming a silicon oxide film, provided by the present invention for achieving the above object, is an apparatus which has a process chamber and is for thermally oxidizing a surface of a silicon layer by introducing water vapor into the process chamber, and which further has dew-formation prevention/evaporation means for preventing dew formation in the process chamber and/or evaporating dew in the process chamber.

According to a first aspect of the present invention for achieving the above object, there is provided a method of forming a silicon oxide film, which method uses an apparatus having a process chamber and dew-formation prevention/evaporation means for preventing dew formation in the process chamber and/or evaporating dew in the process chamber, and in which a substrate having a silicon layer is transferred into the process chamber and water vapor is introduced into the process chamber to thermally oxidize a surface of the silicon layer, the method comprising thermally oxidizing the surface of the silicon layer in the process chamber, then replacing an atmosphere in the process chamber with inert gas in a state where no dew is formed in the process chamber and/or dew in the process chamber is evaporated, to remove water vapor out of the process chamber, and then transferring the substrate out of the process chamber. The replacement of the atmosphere in the process chamber with the inert gas may be initiated after there is brought a state where no dew is formed in the process chamber and/or dew in the process chamber has been evaporated, the above replacement may be initiated when the above state is brought, the above replacement may be initiated before the above state is brought, or the above replacement may be initiated in a state where dew is formed in the process chamber.

The apparatus for forming a silicon oxide film, provided by the present invention, or the apparatus suitable for practicing the method of forming a silicon oxide film according to the first aspect of the present invention further has;

(a) a water vapor generating apparatus, (b) a water vapor inlet port disposed in an upper portion of the process chamber, for introducing water vapor into the process chamber, (c) a gas exhaust portion disposed in a lower portion of the process chamber, for exhausting gas from the process chamber, (d) a substrate transfer portion disposed below the process chamber and allowed to be communicated with the process chamber, (e) a substrate receiving unit composed of a substrate receiving member for receiving a plurality of the substrates having silicon layers and a heat insulation member disposed on the bottom of the substrate receiving member, (f) an elevator unit for elevating the substrate receiving unit upwardly and downwardly to transfer the substrate receiving unit from the substrate transfer portion to the process chamber and from the process chamber to the substrate transfer portion, and (g) a heater unit disposed outside the process chamber for heating the silicon layer, and preferably, the dew-formation prevention/evaporation means is structured so as to prevent dew formation on the surface of the heat insulation member and/or to evaporate dew on a surface of the heat insulation member. Preferably, the heat insulation member is controlled to have a surface temperature in a temperature range of from at least 100° C., preferably up to 150° C., with the dew-formation prevention/evaporation means. The heat insulation member is controlled to have a surface temperature in a temperature range of from at least 100° C., preferably up to 150° C., at least before the substrates are transferred out of the process chamber. The essence is that dew formation in the process chamber can be prevented and/or dew in the process chamber can be evaporated by maintaining the surface temperature of the heat insulation member in the above temperature range. That is, the surface of the heat insulation member may be controlled to have a surface temperature in the above temperature range before the formation of the silicon oxide film and continuously controlled to have the above temperature range during the formation of the silicon oxide film and immediately before the substrates are transferred out of the process chamber. Or, the surface of the heat insulation member may be controlled to have a surface temperature in the above temperature range when the formation of the silicon oxide film is initiated or during the formation of the silicon oxide film and continuously controlled to have a surface temperature in the above temperature range immediately before the substrates are transferred out of the process chamber. Or, the surface of the heat insulation member may be controlled to have a surface temperature in the above temperature range from completion of the formation of the silicon oxide film to a time immediately before the substrates are transferred out of the process chamber.

The dew-formation prevention/evaporation means preferably comprises an inert gas source, an inert gas inlet port disposed in the process chamber, a piping for connecting the inert gas inlet port and the inert gas source, and heating means for heating the inert gas to be introduced into the process chamber. In this case, preferably, the inert gas inlet port is arranged such that flow of the inert gas introduced into the process chamber collides with the heat insulation member. Further, preferably, the dew-formation prevention/evaporation means is provided with means (to be referred to as "moisture content measurement means" hereinafter) for measuring a moisture (water) content of the gas exhausted from the gas exhaust portion, and after the gas exhausted from the gas exhaust portion has a moisture content equal to, or smaller than, a predetermined moisture content, the substrates are preferably transferred out of the process chamber. The above inert gas can be selected from nitrogen gas, argon gas or helium gas. The moisture content measurement means includes a known humidity sensor and a dew-point hygrometer. If the flow of the inert gas introduced into the process chamber collides directly with the silicon layer, the silicon oxide films may have a deviation in thickness or in-plane non-uniformity in film thickness. When the gas exhausted through the gas exhaust portion has a temperature higher than the gas temperature which is measurable with the moisture content measurement means, gas cooling means may be disposed between the gas exhaust portion and the moisture content measurement means. The introduction of the inert gas into the process chamber may be initiated during the transfer of the substrates into the process chamber, the above introduction may be initiated before the formation of the silicon oxide film, the above introduction may be initiated concurrently with the initiation of formation of the silicon oxide film, the above introduction may be initiated during the formation of the silicon oxide film, or the above introduction may be initiated after completion of formation of the silicon oxide film. Further, the introduction of the inert gas into the process chamber can be terminated immediately before, during or after, the transfer of the substrates out of the process chamber.

Alternatively, the dew-formation prevention/evaporation means may comprise an auxiliary heating unit which is disposed outside the process chamber and is for heating the heat insulation member. In this case, the dew-formation prevention/evaporation means may further comprise temperature detecting means for detecting a surface temperature of the heat insulation member and a control unit for controlling the auxiliary heating unit. The above auxiliary heating unit may include a heater, or a piping and a hot medium flowing in the piping. The heater may be a heater according to a resistance heating method or a heater according to lamp heating method. The above temperature detecting means includes a thermocouple attached to, or integrated into, the surface of the heat insulation member, while it may be a temperature detecting means according to any method. The lower portion of the heat insulation member is more easily cooled than the upper portion thereof, and dew is liable to be formed on the surface of the lower portion. It is therefore preferred to attach or integrate the temperature detecting means to or into the surface of the lower portion of the heat insulation member. The operation of the auxiliary heating unit may be initiated before the formation of the silicon oxide film, or the operation of the auxiliary heating unit may be initiated concurrently with the initiation of formation of the silicon oxide film, the operation of the auxiliary heating unit may be initiated during the formation of the silicon oxide film, or the operation of the auxiliary heating unit may be initiated after completion of formation of the silicon oxide film. The operation of the auxiliary heating unit can be terminated immediately before, during or after, the transfer of the substrates out of the process chamber.

In the apparatus for forming a silicon oxide film, provided by the present invention, the water vapor generating apparatus can be at least one apparatus selected from;

(A) an apparatus which generates the water vapor by reacting hydrogen gas and oxygen gas at a high temperature, (B) an apparatus which generates the water vapor by heating pure water, (C) an apparatus which generates the water vapor by bubbling hot pure water with oxygen gas or inert gas, (D) an apparatus which generates the water vapor by reacting hydrogen gas and oxygen gas in the presence of a catalyst, and (E) an apparatus which generates the water vapor by a reaction between oxygen plasma and hydrogen plasma.

In the method of forming a silicon oxide film according to the first aspect of the present invention, preferably, the water vapor to be introduced into the process chamber is preferably generated (A) by reacting hydrogen gas and oxygen gas at a high temperature, (B) by heating pure water, (C) by bubbling hot pure water with oxygen gas or inert gas, (D) by reacting hydrogen gas and oxygen gas in the presence of a catalyst, or by a reaction between oxygen plasma and hydrogen plasma. For generating the water vapor, the above methods may be used alone or in combination.

The method of forming a silicon oxide film according to a second aspect of the present invention for achieving the above object comprises the steps of transferring a substrate having a silicon layer into a process chamber, then, introducing water vapor into the process chamber to thermally oxidize a surface of the silicon layer, then, replacing an atmosphere in the process chamber with an inert gas atmosphere to remove the water vapor and/or dew out of the process chamber, and transferring the substrate out of the process chamber.

In the method of forming a silicon oxide film according to the second aspect of the present invention, preferably, the inert gas exhausted out of the process chamber is measured for a moisture content when the water vapor and/or dew are removed out of the process chamber, and after the inert gas exhausted out of the process chamber has a moisture content equal to, or smaller than, a predetermined value, the substrate is transferred out of the process chamber. The above predetermined value can be a value at which dew is not formed on a transfer unit such as the elevator unit and the like when the substrate is transferred out with the transfer unit. That is, it can be a value equal to, or smaller than, a saturated water vapor pressure in atmosphere outside the process chamber. For example, preferably, it is 0.02 kg per kilogram of dry inert gas, while the predetermined value shall not be limited thereto. Further, preferably, the ambient temperature of the process chamber when the surface of the silicon layer is thermally oxidized and the ambient temperature of the process chamber when the water vapor and/or dew are removed out of the process chamber are nearly equal to each other, and in this case, the ambient temperature of the process chamber for the thermal oxidation of the surface of the silicon layer is preferably 750° C. or lower. The above "nearly equal" implies not only that the above two ambient temperatures are exactly the same but also that the above two ambient temperatures may be different to some extent (for example, by about 20° C.). Hereinafter, "nearly equal" will imply as explained above. When the ambient temperature of the process chamber for and during the thermal oxidation of the surface of the silicon layer is set at a value as explained above, a demand for a decrease in the thickness of the silicon oxide film can be satisfied, and thermal shock on the substrates can be decreased.

In the method of forming a silicon oxide film according to the first or second aspect of the present invention, the water vapor may be in a state where it is entrained by oxygen gas, air or inert gas such as nitrogen gas, argon gas, helium gas or the like when the water vapor is introduced into the process chamber.

Further, when the surface of the silicon layer is thermally oxidized, the ambient atmosphere of the process chamber may contain halogen element. In this case, there can be obtained the silicon oxide film excellent in time-zero dielectric breakdown (TZDB) characteristic and time-dependent dielectric breakdown (TDDB) characteristic. The halogen element can be selected from chlorine, bromine and fluorine, and of these, chlorine is preferred. The halogen element may be in the form of, for example, hydrogen chloride (HCl), $CCl_4$, $C_2HCl_3$, $Cl_2$, HBr or $NF_3$. The content of the halogen element in the ambient atmosphere is 0.001 to 10% by volume, preferably 0.005 to 10% by volume, more preferably 0.02 to 10% by volume, based on the form of a molecule or a compound. For example, when hydrogen chloride gas is used, the content of the hydrogen chloride gas is preferably 0.02 to 10% by volume.

In the method of forming a silicon oxide film according to the first aspect of the present invention, there may be employed the steps of thermally oxidizing the surface of the silicon layer in the process chamber, then replacing an atmosphere of the process chamber with inert gas in a state where no dew is formed in the process chamber and/or dew in the process chamber is evaporated, to remove water vapor out of the process chamber, then, providing an inert gas atmosphere containing halogen element in the process chamber, thereby heat-treating the formed silicon oxide film, and then transferring the substrates out of the process chamber. The replacement of the atmosphere of the process chamber with the inert gas may be initiated after the process chamber has a state where no dew is formed and/or dew in the process chamber is evaporated, concurrently with a time when the process chamber has the above state, before the process chamber has the above state, or while the process chamber has a state where dew is present. Hereinafter, the time when the replacement of the atmosphere of the process chamber with the inert gas is initiated will be also as described above. In some case, after the surface of the silicon layer is thermally oxidized in the process chamber, there may be employed steps of replacing the atmosphere of the process chamber with inert gas in a state where no dew is formed in the process chamber and/or dew in the process chamber is evaporated, to remove water vapor out of the process chamber, then transferring the substrate out of the process chamber, then transferring the substrate into the process chamber again, and providing an inert gas atmosphere containing halogen element in the process chamber to heat-treat the formed silicon oxide film. Alternatively, after substrate is transferred out of the process chamber, there may be employed steps of transferring the substrate into a heat treatment apparatus and providing an inert gas atmosphere containing halogen element in the heat treatment apparatus to heat-treat the formed silicon oxide film.

In the method of forming a silicon oxide film according to the second aspect of the present invention, after the water vapor and/or dew in the process chamber are removed, there may be employed steps of providing an inert gas atmosphere containing halogen element in the process chamber to heat-treat the formed silicon oxide film, and then transferring the substrate out of the process chamber. Alternatively, after the substrate is transferred out of the process chamber, there may be employed steps of transferring the substrate into a heat treatment apparatus and providing an inert gas atmosphere containing halogen element in the heat treatment apparatus to heat-treat the formed silicon oxide film. When the silicon oxide film is heat-treated in the inert gas atmosphere containing halogen element, inter-lattice silicon atoms generated by the thermal oxidation of the silicon layer are diffused into a silicon crystal, and as a result, the interface state can be decreased. Further, due to a terminal effect of terminal bond site, removal of metal impurities and a dehydration effect of hydroxyl group, which are caused by a halogen atom, there can be obtained a silicon oxide film excellent in time-zero dielectric breakdown (TZDB) characteristic and time-dependent dielectric breakdown (TDDB) characteristic. The inert gas for the heat treatment includes nitrogen gas, argon gas and helium gas. Further, the halogen element includes chlorine, bromine and fluorine. Of these, chlorine is preferred. The form of the halogen element contained in the inert gas includes, for example, hydrogen chloride (HCl), $CCl_4$, $C_2HCl_3$, $Cl_2$, HBr and $NF_3$. The content of the halogen element in the inert gas is 0.001 to 10% by volume, preferably 0.005 to 10% by volume, more preferably 0.02 to 10% by volume based on the form of a molecule or a compound. For example, when hydrogen chloride gas is used, the content of the hydrogen chloride gas in the inert gas is preferably 0.02 to 10% by volume.

In the method of forming a silicon oxide film according to the first aspect of the present invention, when the heat treatment is carried out in the process chamber subsequently to the thermal oxidation, desirably, the ambient temperature in the process chamber in the heat treatment is adjusted to 700 to 1200° C., preferably to 700 to 1000° C., more preferably to 700 to 950° C. Or, the ambient temperature in the process chamber in the heat treatment is preferably adjusted so as to be nearly equal to the ambient temperature for the thermal oxidation of the surface of the silicon layer in the process chamber. In the method of forming a silicon oxide film according to the second aspect of the present invention, when the heat treatment is carried out in the process chamber subsequently to the thermal oxidation, the ambient temperature for the heat treatment in the process chamber is preferably adjusted so as to be nearly equal to the ambient temperature for the thermal oxidation of the surface of the silicon layer in the process chamber. In these cases, the time period for the heat treatment is 5 to 60 minutes, preferably 10 to 40 minutes, more preferably 20 to 30 minutes. Since the heat treatment is carried out in a state where no dew is formed in the process chamber, after dew in the process chamber is evaporated, or after water vapor and dew in the process chamber are removed, the formation of, for example, hydrochloric acid by a reaction of hydrogen chloride and water can be reliably prevented when the heat treatment is initiated.

In the method of forming a silicon oxide film according to the first or second aspect of the present invention, when the heat treatment is carried out in a heat treatment apparatus different from the apparatus for forming a silicon oxide film, the heat treatment may be carried out according to single wafer treatment, while it is preferably carried out according to furnace annealing treatment. In this case, the temperature for the heat treatment is 700 to 1200° C., preferably 700 to 1000° C., more preferably 700 to 950° C. The time period for the heat treatment according to the furnace annealing treatment is 5 to 60 minutes, preferably 10 to 40 minutes, more preferably 20 to 30 minutes. The time period for the heat treatment according to the single wafer treatment is desirably 1 to 10 minutes.

The heat treatment may be carried out in a state where the inert gas atmosphere containing halogen element has a lower pressure than atmospheric pressure.

After the heat treatment, the silicon oxide film may be nitridation-treated. The nitridation treatment is preferably carried out in an atmosphere of $N_2O$ gas, NO gas or $N_2$ gas. Of these, it is desirably carried out in an atmosphere of $N_2O$ gas. Otherwise, preferably, the nitridation treatment is carried out in an atmosphere of $NH_3$ gas, $N_2H_4$ gas or hydrazine derivative, and then annealing treatment is carried out in an atmosphere of $N_2O$ gas or $O_2$ gas. Desirably, the nitridation treatment is carried out at 700 to 1200° C., preferably at 800 to 1150° C., more preferably at 900 to 1100° C., and in this case, the silicon layer is preferably heated by infrared irradiation or by furnace annealing treatment. Otherwise, the atmosphere for the heat treatment may be an atmosphere of nitrogen-containing gas. The nitrogen-containing gas includes $N_2$, $NH_3$, $N_2O$, $NO_2$ and NO.

When a MOS semiconductor device is produced from a silicon semiconductor substrate, conventionally, prior to the formation of a gate insulating film, the silicon semiconductor substrate is surface-cleaned by RCA cleaning in which it is cleaned with an $NH_4OH/H_2O_2$ aqueous solution and further cleaned with an $HCl/H_2O_2$ aqueous solution, to remove fine particles and metal impurities from its surface. When the RCA cleaning is carried out, the surface of the silicon semiconductor substrate reacts with the cleaning liquid, to form a silicon oxide film having a thickness of approximately 0.5 to 1 nm. The so-formed silicon oxide film has a non-uniform thickness, and the components of the cleaning liquid remains in the silicon oxide film. The silicon semiconductor substrate is therefore immersed in a hydrofluoric acid aqueous solution to remove the above silicon oxide film, and then a chemical component is removed with pure water, whereby the silicon semiconductor substrate has a surface of which most part is terminated with hydrogen and a very small remaining part is terminated with fluorine. Obtaining a silicon semiconductor substrate surface of which most part is terminated with hydrogen and a very small remaining part is terminated with fluorine will be expressed as exposing the surface of the silicon semiconductor substrate in the present specification. Then, an insulating film, etc., are formed on the above surface of the silicon semiconductor substrate. Meanwhile, if the atmosphere before the formation of the insulating film, etc., is a high-temperature non-oxidizing atmosphere (for example, a nitrogen gas atmosphere), the surface of the silicon semiconductor substrate is roughened (has concave and convex portions formed thereon). The above phenomenon is said to be caused as follows. Part of Si-H bonds and/or Si-F bonds formed on the surface of the silicon semiconductor substrate by cleaning with a hydrofluoric aqueous solution and with pure water are eliminated by hydrogen and/or fluorine dissociation caused by an increase in temperature, and an etching phenomenon takes place on the surface of the silicon semiconductor substrate. For example, "Ultraclean ULSI Technology", page 21, written by Tadahiro Ohmi, issued by Baifu-kan describes that when a silicon semiconductor substrate is temperature-increased to 600° C. or higher in argon gas, the surface of the silicon semiconductor substrate is intensely roughened.

In the method of forming a silicon oxide film according to the first or second aspect of the present invention, it is preferred to initiate the thermal oxidation of the surface of the silicon layer at an ambient temperature at which silicon atoms are dissociated from the surface of the silicon layer for preventing the above phenomenon. Or, it is preferred to initiate the thermal oxidation of the surface of the silicon layer at a temperature of 500° C. or lower, preferably 450° C. or lower, more preferably 400° C. or lower.

The ambient temperature at which silicon atoms are not dissociated from the surface of the silicon layer is preferably a temperature at which a bond between a terminal atom of the surface of the silicon layer and a silicon atom is not broken. In this case, the temperature at which silicon atoms are not dissociated from the surface of the silicon layer is preferably a temperature at which Si-H bonds on the surface of the silicon layer is not broken, or a temperature at which Si-F bonds on the surface of the silicon layer are not broken. When a silicon semiconductor substrate having an orientation (100) is used, each of most hydrogen atoms on the surface of the silicon semiconductor substrate is bound to each of two bonds of each silicon atom, and the surface of the silicon semiconductor substrate has a terminal structure of H-Si-H. However, in a portion where the surface state of the silicon semiconductor substrate is broken (for example, step-formed portion), there is a terminal structure in which one hydrogen atom is bound to only one of two bonds of each silicon atom or a terminal state in which each of hydrogen atoms is bound to each of three bonds of each silicon atom. Generally, remaining bonds of each silicon atom are bound to silicon atoms inside a crystal. The term "Si-H bond" in the present specification includes all of a terminal structure in which each hydrogen atom is bound to each of two bonds of each silicon atom, a terminal structure in which one hydrogen atom is bound to only one of two bonds of each silicon atom and a terminal structure in which hydrogen atom is bound to each of three bonds of each silicon atom. More specifically, the ambient temperature when the formation of the silicon oxide film on the surface of the silicon layer is 200° C. or higher, preferably 300° C. or higher, which is preferred in view of a throughput.

In the method of forming a silicon oxide film according to the first aspect of the present invention, the ambient temperature when the oxidation process is completed may be the same as the ambient temperature employed when the formation of the silicon oxide film is initiated, or the ambient temperature when the oxidation process is completed may be higher than the ambient temperature employed when the formation of the silicon oxide film is initiated. In the latter case, desirably, the ambient temperature when the oxidation process is completed is 600 to 1200° C., preferably 700 to 1000° C. or lower, more preferably 750 to 900° C., while the above ambient temperature shall not be limited to these temperatures. Further, in the latter case, the method may include a first silicon oxide film formation step of initiating the thermal oxidation of the surface of the silicon layer at an ambient temperature at which silicon atoms are not dissociated from the surface of the silicon layer and then maintaining the atmosphere in an ambient temperature range in which silicon atoms are not dissociated from the surface of the silicon layer, for a predetermined period of time, to carry out the thermal oxidation, and a second silicon oxide film formation step of further thermally oxidizing the surface of the silicon layer at an ambient temperature higher than the ambient temperature range in which silicon atoms are not dissociated from the surface of the silicon layer, until the silicon oxide film having a desired thickness is obtained. Desirably, the temperature for the formation of the silicon oxide film in the second silicon oxide film formation step is 600 to 1200° C., preferably 700 to 1000° C. or lower, more preferably 750 to 900° C. In the above first silicon oxide film formation step and the above second silicon oxide film formation step, one oxidation method may be employed, or different oxidation methods may be employed. In the first silicon oxide film formation step, in the second silicon oxide film formation step or in both the first and second silicon oxide film formation steps, the water vapor introduced into the process chamber may be entrained by an inert gas such as nitrogen argon, or helium.

After the first silicon oxide film formation step is finished, there may be employed steps of increasing the ambient temperature in the process chamber, carrying out the second silicon oxide film formation step, replacing the atmosphere in the process chamber with inert gas in a state where no dew is formed in the process chamber and/or dew in the process chamber is evaporated, to remove water vapor from the process chamber, and then transferring the substrate out of the process chamber. Otherwise, there may be employed steps of carrying out the first silicon oxide film formation step in a first process chamber, then replacing the atmosphere in the first process chamber with inert gas in a state where no dew is formed in the first process chamber and/or dew in the first process chamber is evaporated, to remove water vapor from the first process chamber, then transferring the substrate out of the first process chamber, transferring the substrate into a second process chamber, carrying out the second silicon oxide film formation step in the second process chamber, then replacing the atmosphere in the second process chamber with inert gas in a state where no dew is formed in the second process chamber and/or dew in the second process chamber is evaporated, to remove water vapor from the second process chamber, and then transferring the substrate out of the second process chamber. In this case, there may be used an apparatus for forming a silicon oxide film having a structure in which one substrate transfer portion is commonly provided and two process chambers are provided above the substrate transfer portion, or there may be used two apparatuses for forming a silicon oxide film. In the latter case, preferably, the two apparatuses are connected with a vacuum transfer passage or a transfer passage filled with inert gas. In any case where the first silicon oxide film formation step and the second silicon oxide film formation step are carried out in one process chamber or in different process chambers, the heat treatment may be carried out after the second silicon oxide film formation step is carried out.

In the method of forming a silicon oxide film according to the second aspect of the present invention, the ambient temperature when the oxidation process is completed may be the same as the ambient temperature employed when the formation of the silicon oxide film is initiated, or the ambient temperature when the oxidation process is completed may be higher than the ambient temperature employed when the formation of the silicon oxide film is initiated. In the latter case, desirably, the ambient temperature when the oxidation process is completed is 750° C. or lower, preferably 600 to 700° C., while the above ambient temperature shall not be limited to these temperatures. Further, in the latter case, the method may include a first silicon oxide film formation step of initiating the thermal oxidation of the surface of the silicon layer at an ambient temperature at which silicon atoms are not dissociated from the surface of the silicon layer and then maintaining the atmosphere in an ambient temperature range in which silicon atoms are not dissociated from the surface of the silicon layer, for a predetermined period of time, to carry out the thermal oxidation, and a second silicon oxide film formation step of further thermally oxidizing the surface of the silicon layer at an ambient temperature higher than the ambient temperature range in which silicon atoms are not dissociated from the surface of the silicon layer, until silicon oxide films having a desired thickness are obtained. Desirably, the temperature for the formation of the silicon oxide film in the second silicon oxide film formation step is 750° C. or lower, preferably 600 to 750° C. In the above first silicon oxide film formation step and the above second silicon oxide film formation step, one oxidation method may be employed, or different oxidation methods may be employed. In the first silicon oxide film formation step, in the second silicon oxide film formation step or in both the first and second silicon oxide film formation steps, the water vapor introduced into the process chamber may be entrained by an inert gas such as nitrogen argon, or helium. After the first silicon oxide film formation step is finished, there may be employed steps of increasing the ambient temperature in the process chamber, carrying out the second silicon oxide film formation step, removing the water vapor and/or dew from the process chamber, and then transferring the substrate out of the process chamber. Otherwise, there may be employed steps of carrying out the first silicon oxide film formation step in a first process chamber, then removing the water vapor and/or dew from the first process chamber, then transferring the substrate out of the first process chamber, transferring the substrate into a second process chamber, carrying out the second silicon oxide film formation step in the second process chamber, then removing the water vapor and/or dew from the second process chamber, and then transferring the substrate out of the second process chamber. In this case, there may be used an apparatus for forming a silicon oxide film having a structure in which one substrate transfer portion is commonly provided and two process chambers are provided above the substrate transfer portion, or there may be used two apparatuses for forming a silicon oxide film. In the latter case, preferably, the two apparatuses are connected with a vacuum transfer passage or a transfer passage filled with inert gas. In any case where the first silicon oxide film formation step and the second silicon oxide film formation step are carried out in one process chamber or in different process chambers, the heat treatment may be carried out after the second silicon oxide film formation step is carried out.

The silicon oxide film after the second silicon oxide film formation step can have a thickness as required depending upon a semiconductor device. The silicon oxide film after the first silicon oxide film formation step preferably has a thickness which is as small as possible. Silicon semiconductor substrates used for the production of semiconductor devices at present have a (100) crystal orientation in most cases, and however well the surface of the silicon semiconductor substrate is smoothened, a level difference called a step is necessarily formed on the (100) silicon surface. The step generally has a level difference by one layer of silicon atoms, while a level difference by 2 or 3 layers is sometimes formed. When a (100) silicon semiconductor substrate is used as a silicon layer, therefore, it is preferred that the silicon oxide film after the first silicon oxide film formation step should have a thickness of at least 1 nm, while the thickness shall not be limited thereto.

Before the silicon oxide film is formed on the silicon layer, generally, the surface of the silicon layer is cleaned by RCA cleaning in which the surface of the silicon layer is cleaned with an $NH_4OH/H_2O_2$ aqueous solution and further cleaned with an $HCl/H_2O_2$ aqueous solution, to remove fine particles and metal impurities from its surface, and then the silicon layer is immersed in a hydrofluoric acid aqueous solution. However, if the silicon layer is then exposed to atmosphere, the surface of the silicon layer is contaminated, water or an organic substance may adhere to the surface of the silicon layer, or Si atoms in the surface of the silicon layer may bond to hydroxyl groups (OH) (for example, see "Highly-reliable Gate Oxide Formation for Giga-Scale LSIs by using Closed Wet Cleaning System and Wet Oxidation with Ultra-Dry Unloading", J. Yugami, et al., International Electron Device Meeting Technical Digest 95, pages 855–858). In the above case, if the formation of the silicon oxide film is initiated in the above state, a resulting silicon oxide film includes water and an organic substance or Si—OH, which may downgrade the characteristics of the silicon oxide film or may cause a defective portion. The defective portion refers to a portion of a silicon oxide film containing a silicon-dangling bond (Si) or Si—H bond, or a portion of a silicon oxide film containing Si—O—Si bond which is compressed due to a stress or has a bond angle different from that of Si—O—Si in a thick or bulk silicon oxide film. For avoiding the above problem, therefore, it is preferred to include the step of cleaning the surface of the silicon layer before the formation of the silicon oxide film and carry out the step of forming the silicon oxide film without exposing the cleaned silicon layer to atmosphere (for example, by maintaining an inert gas atmosphere or a vacuum atmosphere in and from the cleaning of the surface of the silicon layer to the initiation of formation of the silicon oxide film). In this manner, there can be formed the silicon oxide film on that surface of the silicon layer which is terminated with hydrogen in most parts and terminated with fluorine in vary small remaining parts, and the downgrading of characteristics of the formed silicon oxide film or the occurrence of defective portions can be prevented.

In the method of forming a silicon oxide film according to the first or second aspect of the present invention, the silicon layer refers to a silicon layer on which a silicon oxide film is to be formed. The substrate having a silicon layer includes a silicon semiconductor substrate and the like. In this case, the silicon layer is also the silicon semiconductor substrate. Further, the substrate having a silicon layer includes a substrate on which an epitaxial silicon layer (including an epitaxial silicon layer formed by selective epitaxial growth method), a polycrystalline silicon layer, an amorphous silicon layer is formed, a substrate on which a silicon layer of an SOI structure is formed by a so-called laminating or SIMOX method, or a substrate having a silicon layer in which a semiconductor device or a semiconductor device element is formed. The silicon semiconductor substrate may be produced by any one of a cz method, an MCZ method, a DLCZ method and an FZ method, and it may also be a silicon semiconductor substrate of which the crystal defect is removed beforehand by high-temperature hydrogen annealing method. When the silicon layer is a silicon semiconductor substrate itself, the silicon semiconductor substrate corresponds to the substrate and the silicon layer.

The method of forming a silicon oxide film, provided by the present invention, can be applied to the formation of silicon oxide films in various semiconductor devices such as the formation of a gate oxide film, a dielectric interlayer or an isolation region of a MOS type transistor, the formation of a gate oxide film of a top gate type or bottom gate type thin-film transistor, and the formation of a tunnel oxide film of a flash memory.

In the apparatus for forming a silicon oxide film or the method of forming a silicon oxide film according to the first aspect of the present invention, the dew-formation prevention/evaporation means is provided. In the method of forming a silicon oxide film according to the second aspect of the present invention, the substrates are transferred out of the process chamber after an inert gas atmosphere is provided in the process chamber and after water vapor and/or dew in the process chamber are removed. Therefore, metal members constituting the apparatus for forming a silicon oxide film are not corroded with water, and there can be prevented the problem that stains similar to water marks occur on a surface of a silicon layer and cause an in-plane non-uniformity in the thickness of the silicon oxide film. Particularly, when a silicon oxide film is formed at an ambient temperature at which silicon atoms are not dissociated from the surface of the silicon layer, the above problems are liable to occur, while the present invention can reliably prevent the occurrence of the above problems. Otherwise, when an inert gas atmosphere containing halogen atom is provided in the process chamber to heat-treat the formed silicon oxide film subsequently to the formation of the silicon oxide film in the process chamber, and if water remains in the process chamber, for example, hydrochloric acid is formed and it corrodes metal members constituting an apparatus for forming a silicon oxide film. In the present invention, the above phenomenon can be reliably prevented.

BRIEF DESCRIPTION OF THE DRAWINGS

The present invention will be explained with reference to preferred examples by referring to drawings.

FIG. 6B is a conceptual view of the apparatus and the like for forming a silicon oxide film, for explaining the method of forming a silicon oxide film in Example 1.

DESCRIPTION OF THE PREFERRED EMBODIMENTS

EXAMPLE 1

Figure 1:
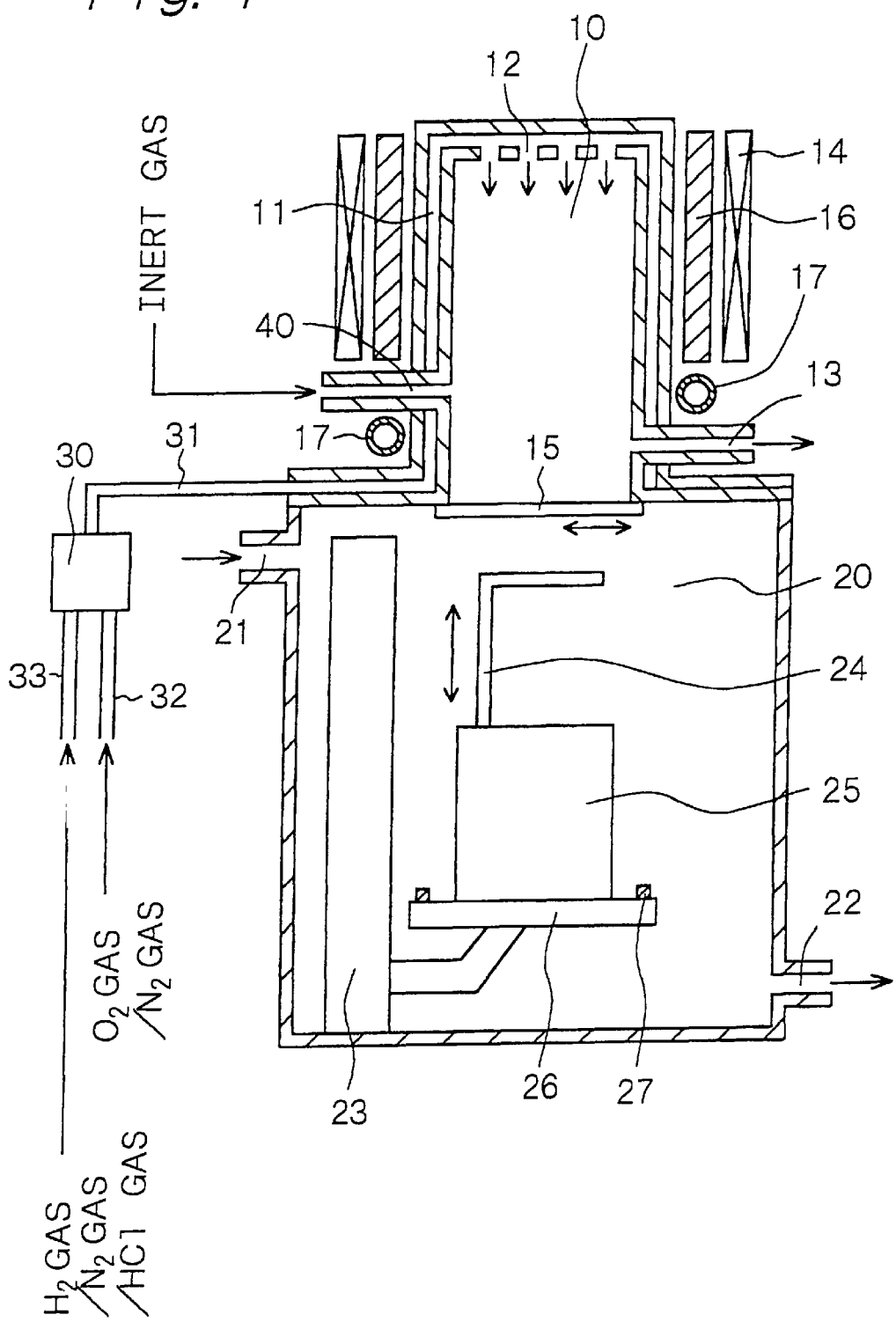
FIG. 1 is a schematic view of an apparatus for forming a silicon oxide film in Example 1.

Example 1 is concerned with the apparatus for forming a silicon oxide film, provided by the present invention, and the method of forming a silicon oxide film according to the first aspect of the present invention. FIG. 1 schematically shows the apparatus for forming a silicon oxide film in Example 1. This vertical-type apparatus comprises; (A) a double-tubular structured process chamber 10 made of quartz and held perpendicularly; (B) a water vapor inlet port 12 which is disposed in an upper portion of the process chamber and is for introducing water vapor into the process chamber 10; (C) a gas exhaust portion 13 which is disposed in a lower portion of the process chamber and is for exhausting gas from the process chamber 10; (D) a resistance-heating type heater 14 which is a heater unit disposed outside the process chamber 10 and is for maintaining an inside of the process chamber 10 at a predetermined ambient temperature through a cylindrical heat equalizer tube 16 made of SiC to heat silicon semiconductor substrates 50 (not shown) corresponding to silicon layers; (E) a substrate transfer portion 20 which is disposed below the process chamber 10 and is allowed to be communicated with the process chamber 10; (F) a gas introducing portion 21 for introducing nitrogen gas into the substrate transfer portion 20; (G) a gas exhaust portion 22 for exhausting gas from the substrate transfer portion 20; (H) a shutter 15 for partitioning the process chamber 10 and the substrate transfer portion 20; (I) a substrate receiving unit; and (J) an elevator unit 23 for elevating the substrate receiving unit up and down to bring the substrates into and out of the process chamber 10, that is, for elevating the substrate receiving unit upwardly and downwardly to transfer the substrate receiving unit from the substrate transfer portion 20 to the process chamber 10 and from the process chamber 10 to the substrate transfer portion 20. Alternatively, the heater disposed outside the process chamber 10 and used for heating silicon semiconductor substrates 50 corresponding to silicon layers may be constituted of a plurality of lamps which emit infrared light or visible light.

The substrate receiving unit comprises a substrate receiving member (also called a boat) 24 for receiving and placing the substrates having silicon layers (specifically, silicon semiconductor substrates 50) and a heat insulation member 25 disposed below the substrate receiving member 24. Further, the substrate receiving unit has a base portion 26, and the base portion 26 is attached to the elevator unit 23. The substrate receiving member 24 is made of quartz or SiC. A seal member 27 formed of, for example, an "O" ring is attached to a marginal portion of the upper surface of the base portion 26, and when the substrate receiving member 24 is brought into the process chamber 10, the lower portion of the process chamber 10 is structurally sealed with the base portion 26. The heat insulation member 25 is a hollow cylindrical member which has top and bottom surfaces closed and is formed of quartz glass, and the hollow portion is filled with, for example, glass fiber. Further, outside the process chamber 10 and near the heat insulation member 25, a piping is provided for flowing coolant. The base portion 26 is structured also to permit flowing of coolant inside. The heat insulation member 25 is disposed, and the coolant is flowed inside the piping 17 and the base portion 26, whereby damage of the sealing member 27 or the malfunction of the elevator unit 23 caused by radiation heat directly transmitted to the base portion 26 in the process chamber 10 can be prevented.

A water vapor generating apparatus comprises a combustion chamber 30, pipings 32 and 33 for supplying oxygen gas and hydrogen gas into the combustion chamber 30, and a piping 31 for supplying generated water vapor to the process chamber 10. Hydrogen gas and oxygen gas supplied to the combustion chamber 30 are mixed at a high temperature in the combustion chamber to combust the hydrogen gas, whereby the water vapor is generated. That is, the water vapor is generated by a so-called pyrogenic method. The so-generated water vapor is introduced into the process chamber 10 through the piping 31, a gas flow passage 11 and the water vapor inlet port 12. The gas flow passage 11 corresponds to a space between an inner wall and an outer wall of the double-tubular-structured process chamber 10.

The apparatus for forming a silicon oxide film in Example 1 further comprises dew-formation prevention/evaporation means for preventing dew formation in the process chamber, specifically, on the surface of the heat insulation member and/or evaporating dew in the process chamber, specifically, on the surface of the heat insulation member. The dew-formation prevention/evaporation means comprises an inert gas source, an inert gas inlet port 40 disposed in the process chamber 10, a piping connecting the inert gas inlet port 40 and the inert gas source, and heating means for heating the inert gas to be introduced into the process chamber 10. Showing of the inert gas source, the piping and the heating means is omitted. In Example 1, nitrogen gas is used as inert gas. The inert gas inlet port 40 is arranged in the process chamber 10 such that the flow of the inert gas introduced into the process chamber 10 collides with the heat insulation member 25, and in no case the flow of the inert gas introduced into the process chamber 10 collides directly with the silicon semiconductor substrates 50 (see FIG. 2). Therefore, the flow of the water vapor introduced into the process chamber 10 through the water vapor inlet port 12 is not made turbulent, and further, neither in-plane thickness non-uniformity is caused, nor thickness non-uniformity is caused among the formed silicon oxide films. FIG. 3 shows a schematic configuration of the inert gas inlet port 40, the gas flow passage 11 and the gas exhaust portion 13, and the configuration in FIG. 3 is a schematic cross-sectional view of the double-tubular-structured process chamber 10 viewed from above. In Example 1, the surface temperature of the heat insulation member 25 is controlled so as to prevent the dew-formation prevention/evaporation means from deteriorating and damaging the sealing member 27 or from causing damage on the substrate receiving unit and the elevator unit 23. Specifically, the surface (outer surface) temperature of the heat insulation member 25 is controlled to be in the range of from 100 to 150° C. The above controlling can be performed by attaching or incorporating a thermocouple (not shown) to the surface of the heat insulation member 25, measuring the heat insulation member 25 for a surface temperature with the thermocouple and controlling heating means (for example, heater) used for heating the inert gas with a controller unit (for example, PID controller, not shown), on the basis of an output of the thermocouple.

Figure 2:
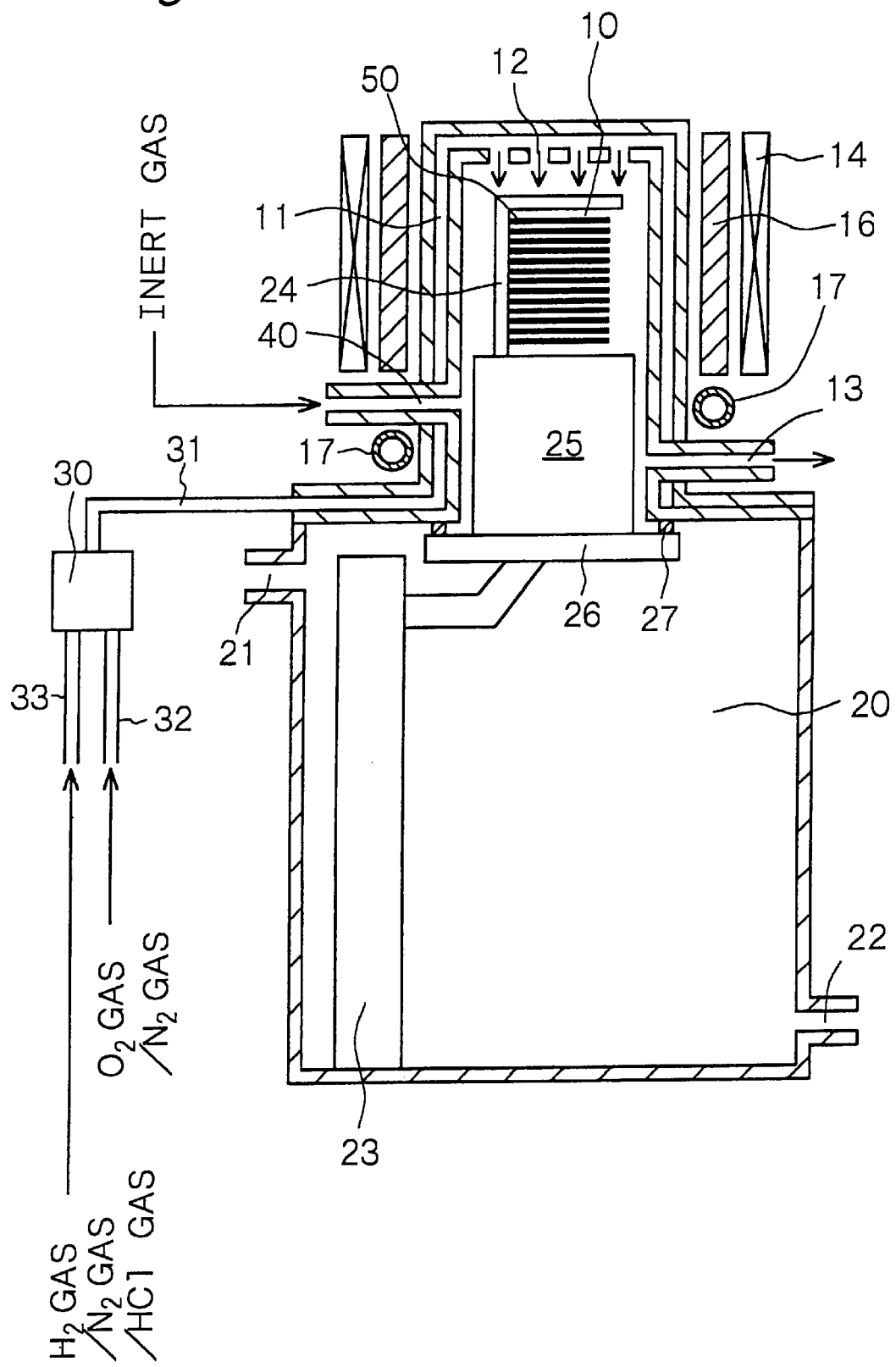
FIG. 2 schematically shows a state where semiconductor substrates are transferred into a process chamber and the surfaces of the silicon layers are thermally oxidized in the apparatus in Example 1.
Figure 3:
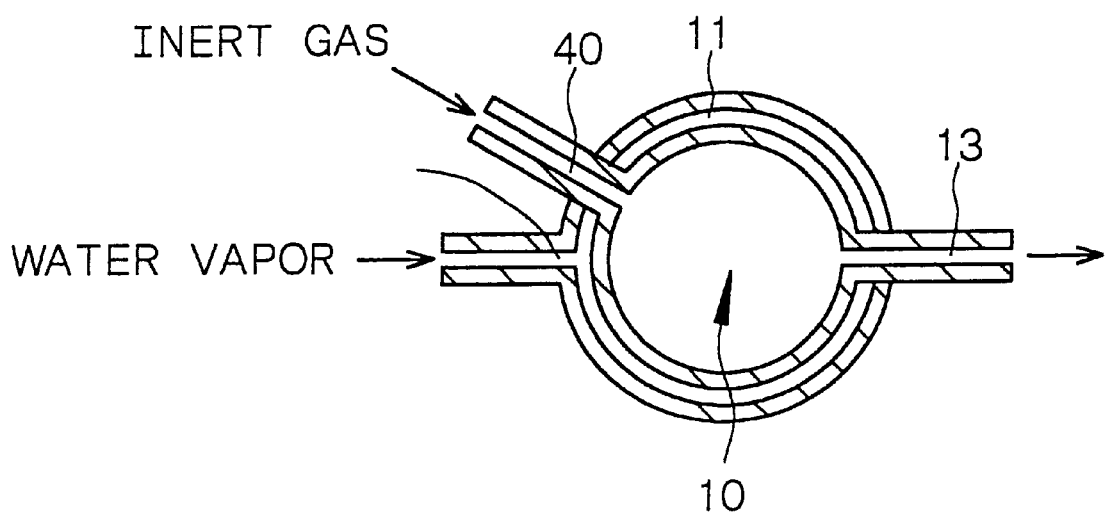
FIG. 3 schematically shows a configuration of an inert gas inlet port, a gas flow passage and a gas exhaust portion.

The method of forming a silicon oxide film with the apparatus shown in FIG. 1 will be explained with reference to FIG. 2 showing a schematic view of the apparatus and FIGS. 4A, 4B, 5A, 5B, 6A, 6B and 7 which are conceptual views of the apparatus and the like. [Step-100]

First, an isolation region having a LOCOS structure is formed in a silicon semiconductor substrate 50 which is a phosphorus-doped N-type silicon wafer having a diameter of 8 inches (produced by a Czochralski method), and then well ion implanting, channel stop ion implanting and threshold adjustment ion implanting are carried out. The isolation region may have a trench structure or a combination of a LOCOS structure and a trench structure. Then, fine particles and metal impurities on the surface of the silicon semiconductor substrate 50 are removed by RCA cleaning, and the surface of the silicon semiconductor substrate 50 is cleaned with a 0.1% hydrofluoric acid aqueous solution to expose the surface of the silicon semiconductor substrate 50. on the surface of the silicon semiconductor substrate 50, most part thereof is terminated with hydrogen, and a remaining very small part is terminated with fluorine. [Step-110]

Figure 4A:
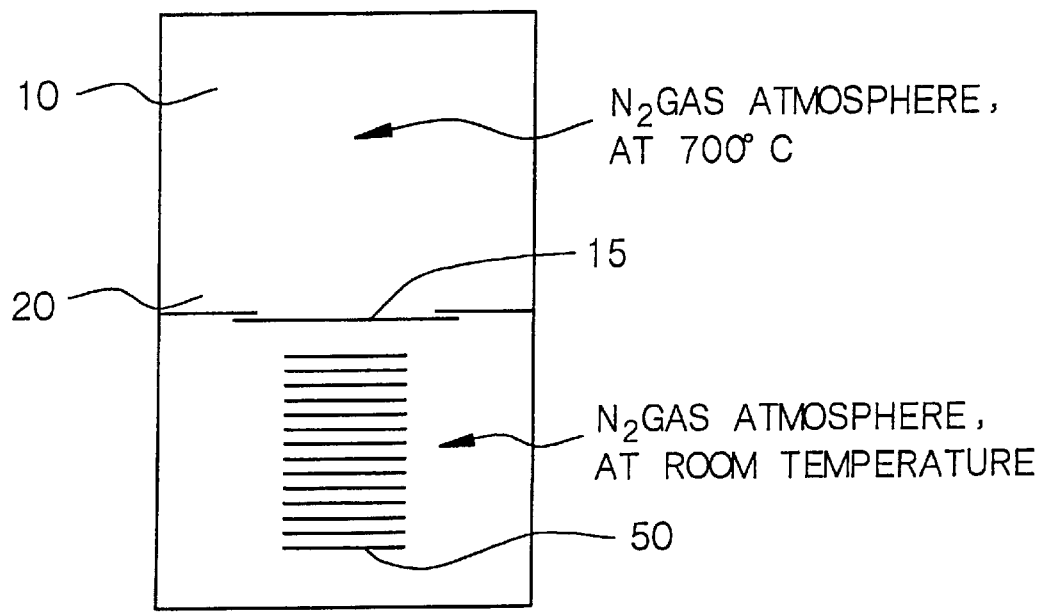
FIGS. 4A and 4B are conceptual views of an apparatus and the like for forming a silicon oxide film, for explaining the method of forming a silicon oxide film in Example 1.
Figure 4B:
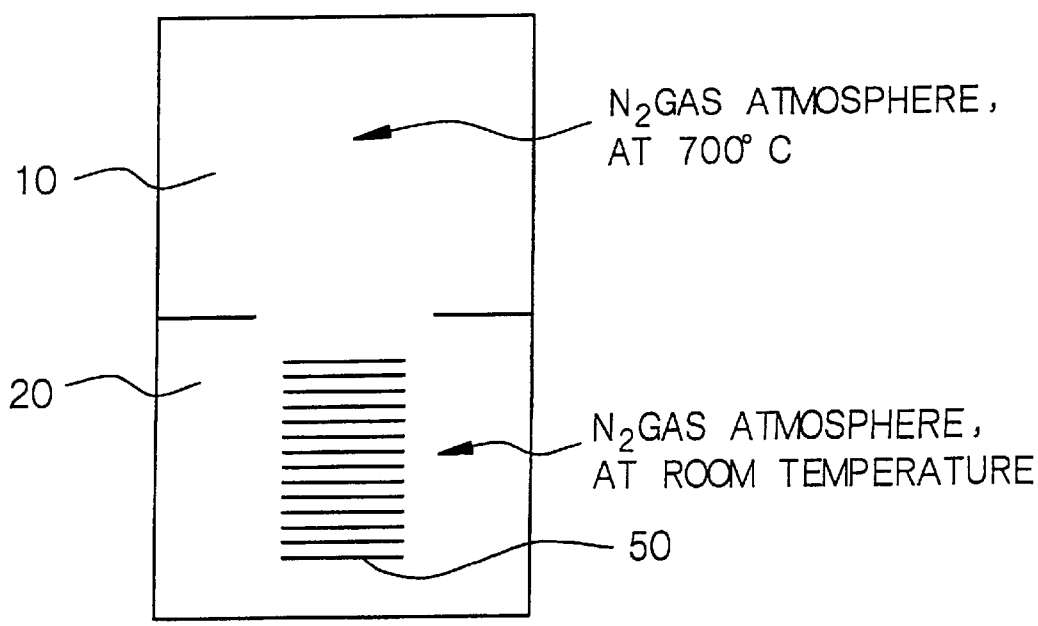
Figure 5A:
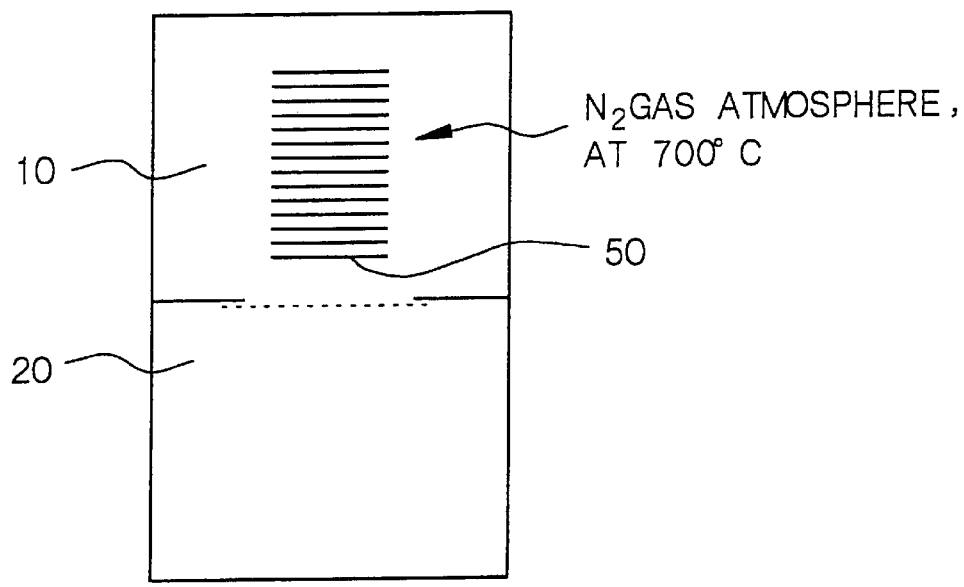
FIGS. 5A and 5B following FIG. 4B are conceptual views of the apparatus and the like for forming a silicon oxide film, for explaining the method of forming a silicon oxide film in Example 1.
Figure 5B:
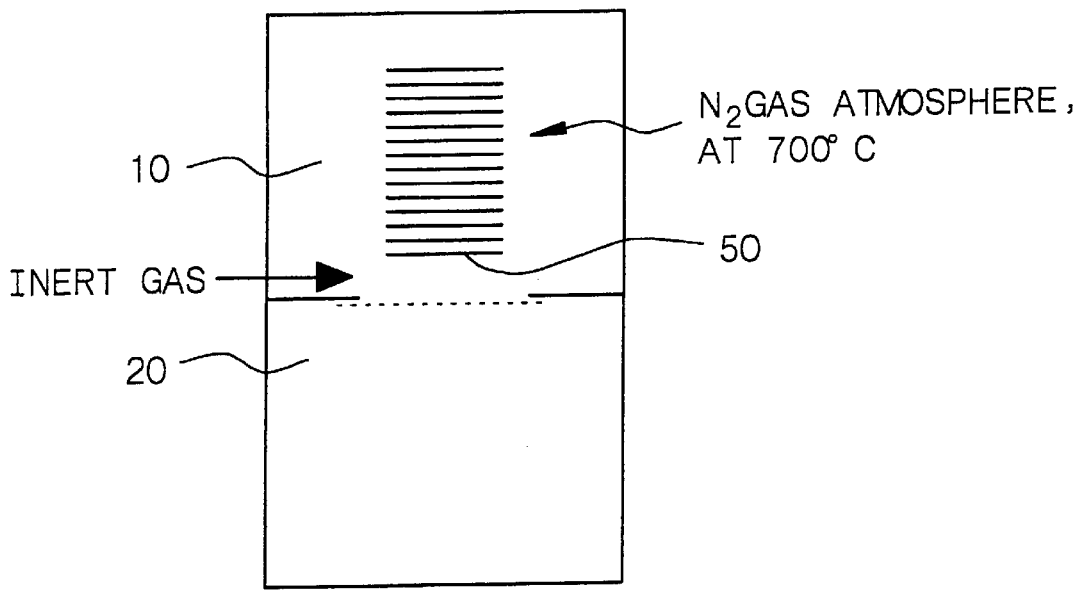
Figure 6A:
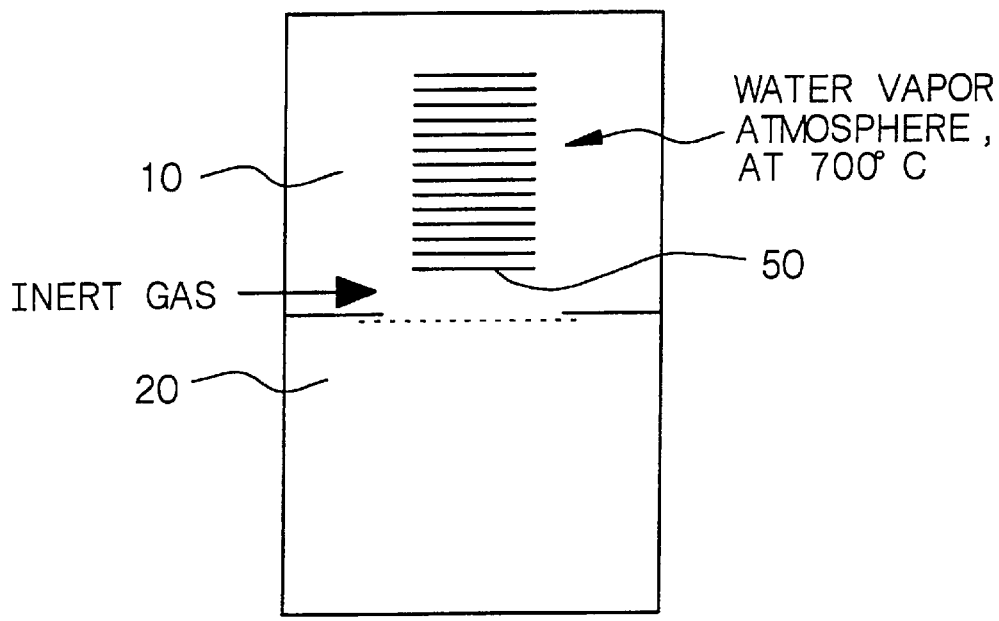
FIGS. 6A and 6B following FIG. 5B are conceptual views of the apparatus and the like for forming a silicon oxide film, for explaining the method of forming a silicon oxide film in Example 1.
Figure 6B:
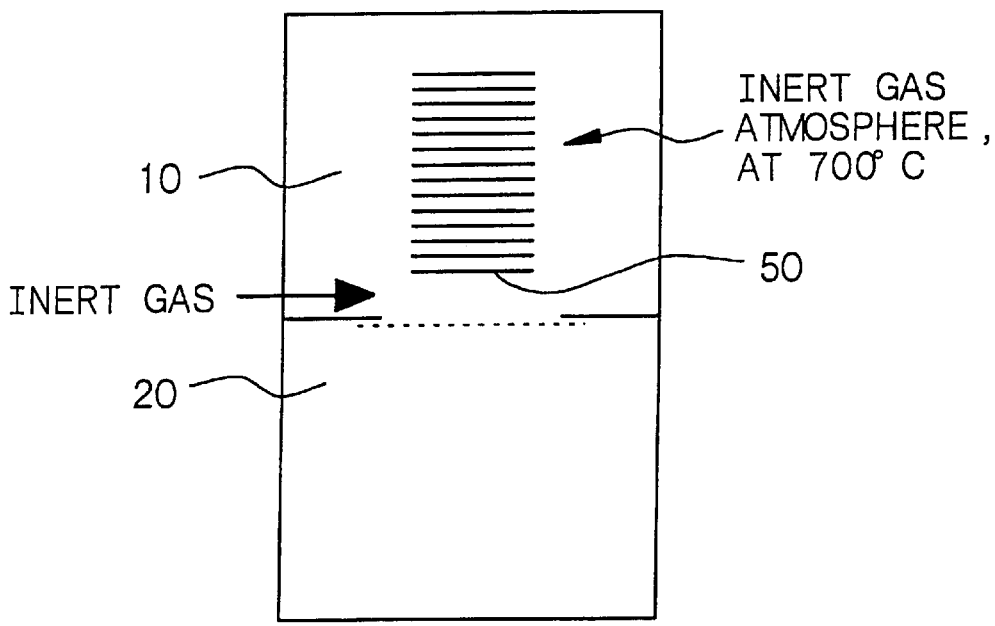
Figure 7:
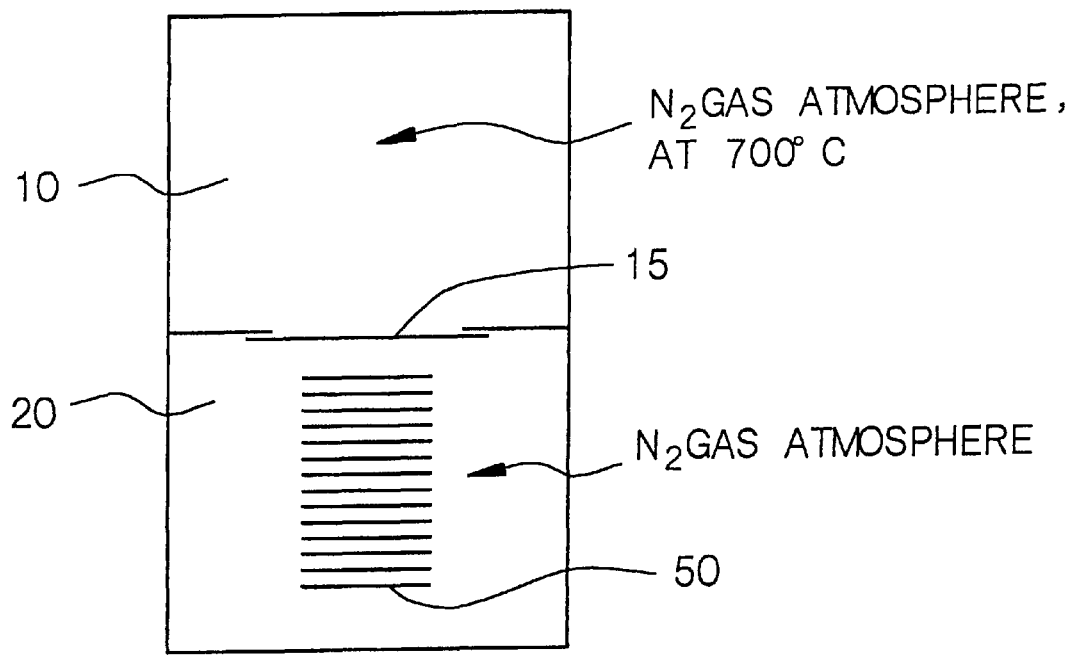
FIG. 7 following

The silicon semiconductor substrates 50 prepared in the above manner are transferred into the substrate transfer portion 20 of the apparatus shown in FIG. 1 through a door (not shown), and placed on the substrate receiving member 24 (see FIG. 4A). Nitrogen gas is introduced into the process chamber 10 through the water vapor inlet port 12 to provide an inert gas atmosphere such as a nitrogen gas atmosphere in the process chamber 10 (it may be an atmosphere under reduced pressure), and an ambient temperature in the process chamber 10 is maintained at 700° C. through the heat equalizer tube 16 with the heater 14. Further, coolant is flowed in the piping 17. In this state, the shutter 15 is kept closed. [Step-120]

After the transfer of the silicon semiconductor substrates 50 into the substrate transfer portion 20 is completed, the door (not shown) is closed, and nitrogen gas is introduced into the substrate transfer portion 20 through the gas introducing portion 21 and exhausted through the gas exhaust portion 22 to provide a nitrogen gas atmosphere in the substrate transfer portion 20. An oxygen gas concentration in the substrate transfer portion 20 is monitored, and when the oxygen gas concentration comes to be, for example, 100 ppm or less, it is judged that a sufficient nitrogen gas atmosphere is provided in the substrate transfer portion 20. Then, while coolant is flowed inside the base portion 26, the shutter 15 is opened (see FIG. 4B), and the elevator unit 23 is operated to move the substrate receiving member 24 upwardly (elevation rate: 50 mm/minute), whereby the silicon semiconductor substrates 50 are transferred into the double-tubular-structured process chamber 10 made of quartz (see FIG. 5A). When the elevator unit 23 reaches its uppermost position, the process chamber 10 and the substrate transfer portion 20 are no longer communicated with each other with the base portion 26 of the substrate receiving member 24. [Step-130]

Then, nitrogen gas as the inert gas is introduced into the process chamber 10 from the inert gas source through the piping and the inert gas inlet port 40. The heating means for heating the inert gas is controlled to give a surface temperature of 120° C. on the heat insulation member 25 (see FIG. 5B). The flow rate of the nitrogen gas is set at 5 SLM. [Step-120] and [Step-130] may be exchanged. When the inert gas is continuously introduced into the process chamber 10 through the inert gas inlet port 40 during the transfer of the silicon semiconductor substrates 50 into the process chamber 10, the inert gas concentration in a bottom portion of the process chamber 10 increases, and the formation of silicon oxide films formed by entraining atmosphere during the transfer of the silicon semiconductor substrates into the process chamber 10 can be more reliably prevented. [Step-140]

After the ambient temperature in the process chamber 10 is fully stabilized at 700° C., oxygen gas (flow rate: 10 SLM) and hydrogen gas (flow rate: 10 SLM) are supplied to the combustion chamber 30 through the pipings 32 and 33, and the oxygen gas and the hydrogen gas are mixed at a high temperature in the combustion chamber 30 to combust the hydrogen. Formed water vapor is introduced into the process chamber 10 through the piping 31, the gas flow passage 11 and the water vapor inlet port 12, and exhausted through the gas exhaust portion 13 (see FIGS. 2 and 6A), whereby the surfaces of the silicon layers are thermally oxidized. That is, a silicon oxide film is formed on the surface of each of the silicon semiconductor substrates 50. The temperature in the combustion chamber 30 is maintained at 700 to 900° C., for example, with a heater (not shown). During the formation of the silicon oxide film, the nitrogen gas as the inert gas is continuously introduced into the process chamber 10 from the inert gas source through the piping and the inert gas inlet port 40. If the nitrogen gas is not continuously introduced into the process chamber 10 from the inert gas source through the piping and the inert gas inlet port 40 during the formation of the silicon oxide films, the heat insulation member 25 frequently has a temperature of less than 100° C., and dew is formed on the surface of the heat insulation member 25. [Step-150]

After the formation of the silicon oxide films having a thickness of, for example, approximately 2.5 nm, the supply of the water vapor into the process chamber is terminated, nitrogen gas is introduced into the process chamber 10 through the water vapor inlet portion 12, to provide an inert gas atmosphere (temperature: 700° C.) such as a nitrogen gas atmosphere in the process chamber 10. That is, the atmosphere in the process chamber 10 is replaced with inert gas, to remove water vapor from the process chamber 10. The nitrogen gas as the inert gas is continuously introduced into the process chamber 10 from the inert gas source through the piping and the inert gas inlet port 40 (see FIG. 6B). When a predetermined period of time passes after the termination of supply of the water vapor to the process chamber 10, the elevator unit 23 is operated to move the substrate receiving member 24 downwardly, and the shutter 15 is closed (see FIG. 7). The silicon semiconductor substrates 50 are transferred out of the substrate transfer portion 20. When forming silicon oxide films is tested under various conditions to study whether or not no dew is formed on the surface of the heat insulation member 25, and when it is found that no dew is formed on the surface of the heat insulation member 25, the elevator unit 23 may be operated immediately after the termination of supply of the water vapor into the process chamber 10. Further, dew is sometimes formed on the surface of the heat insulation member 25 depending on when inert gas is introduced into the process chamber 10. In this case, forming silicon oxide films is tested under various conditions to determine a time period for which dew on the surface of the heat insulation member 25 is reliably evaporated, and the above time period can be taken as a time period from the termination of supply of the water vapor into the process chamber 10 to the operation of the elevator unit 23.

When it is intended to form a silicon oxide film having still higher characteristics, it is preferred to heat-treat the silicon oxide film as explained below. That is, after [Step-140], there is provided a state where no dew is formed on the surface of the heat insulation member 25, or dew on the surface of the heat insulation member 25 is evaporated. Then, the atmosphere in the process chamber 10 is replaced with inert gas, and the water vapor is removed from the process chamber 10. Then, nitrogen gas containing 0.15% by volume of hydrogen chloride gas (hydrogen chloride gas: 15 SCCM/nitrogen gas: 10 SLM) is introduced into the process chamber 10 through the water vapor inlet port 12, and heat treatment is carried out at an ambient temperature of 700° C. for 30 minutes. Thereafter, a nitrogen gas atmosphere is provided in the process chamber 10, and the elevator unit 23 is operated to move the substrate receiving member 24 downwardly. Then, the silicon semiconductor substrates 50 are transferred out of the substrate transfer portion 20.

Figure 8:
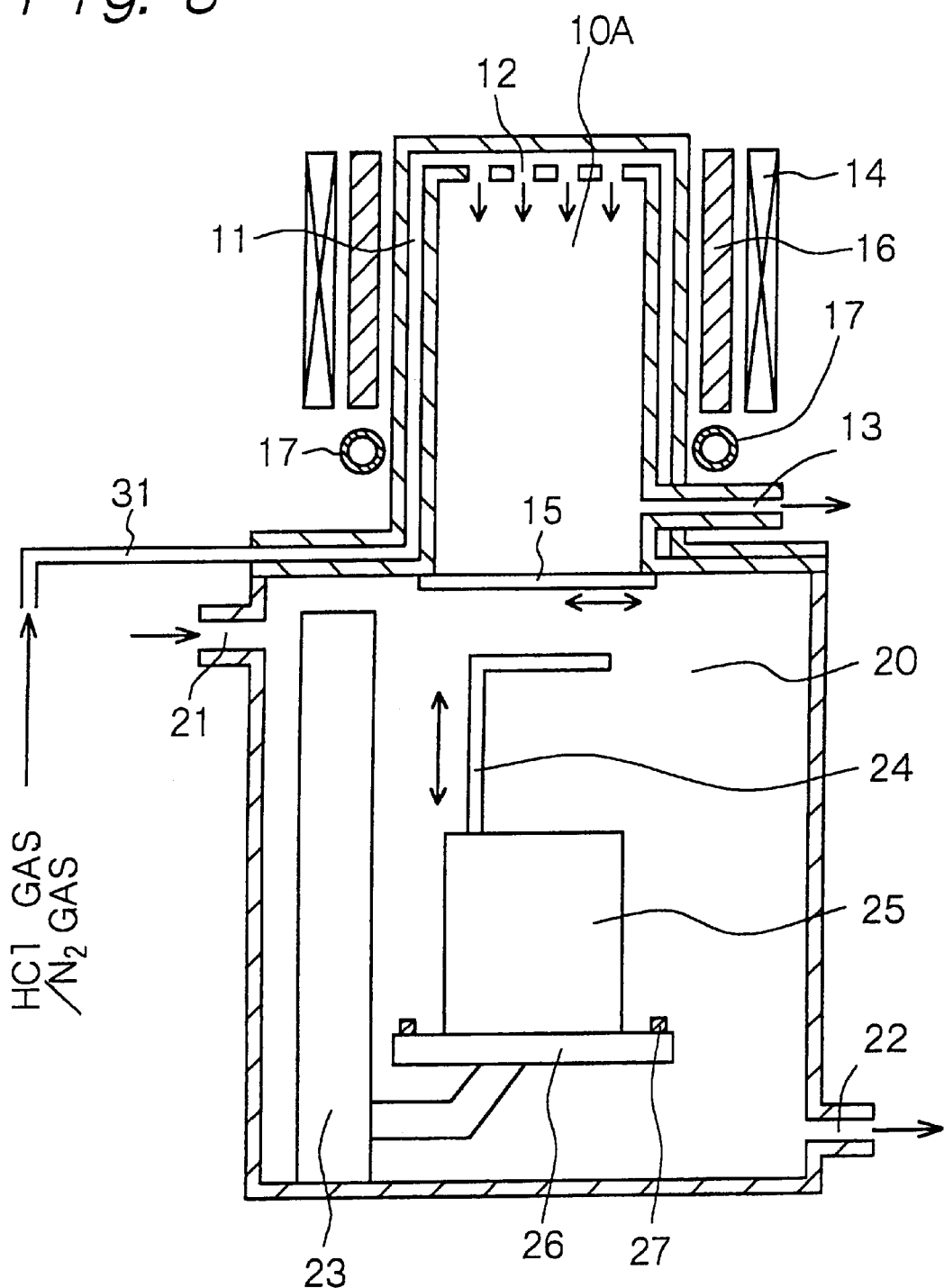
FIG. 8 is a schematic view of a heat-treatment apparatus.

Otherwise, after [Step-150], the formed silicon oxide films may be heat-treated as follows. The silicon semiconductor substrates 50 having silicon oxide films formed on their surfaces are transferred into a process chamber 10A of a heat treatment apparatus which is schematically shown in FIG. 8. A nitrogen gas atmosphere having a temperature of 700° C. is provided in the process chamber 10A in advance. After the silicon semiconductor substrates 50 are transferred into the process chamber 10A, the ambient temperature in the process chamber 10A is increased up to 800° C. at a rate of 5° C./minute, and then, the atmosphere in the process chamber 10A is replaced with an inert gas atmosphere containing halogen element (for example, a nitrogen gas atmosphere containing 0.1% by volume of hydrogen chloride and having a temperature of 800° C., in which hydrogen chloride gas: 10 SCCM/nitrogen gas: 10 SLM), to heat-treat the formed silicon oxide films for 30 minutes. The heat treatment apparatus is substantially structurally the same as the apparatus for forming a silicon oxide film shown in FIG. 1, except that the water vapor generating apparatus and the dew-formation prevention/evaporation means are not provided and that an inert gas source and a hydrogen chloride gas source are provided instead. Detailed explanations of the heat treatment apparatus are therefore omitted. Those components of the heat treatment apparatus in FIG. 8 which are the same as the components of the apparatus in FIG. 1 are shown by the same reference numerals as those in FIG. 1.

Figure 9:
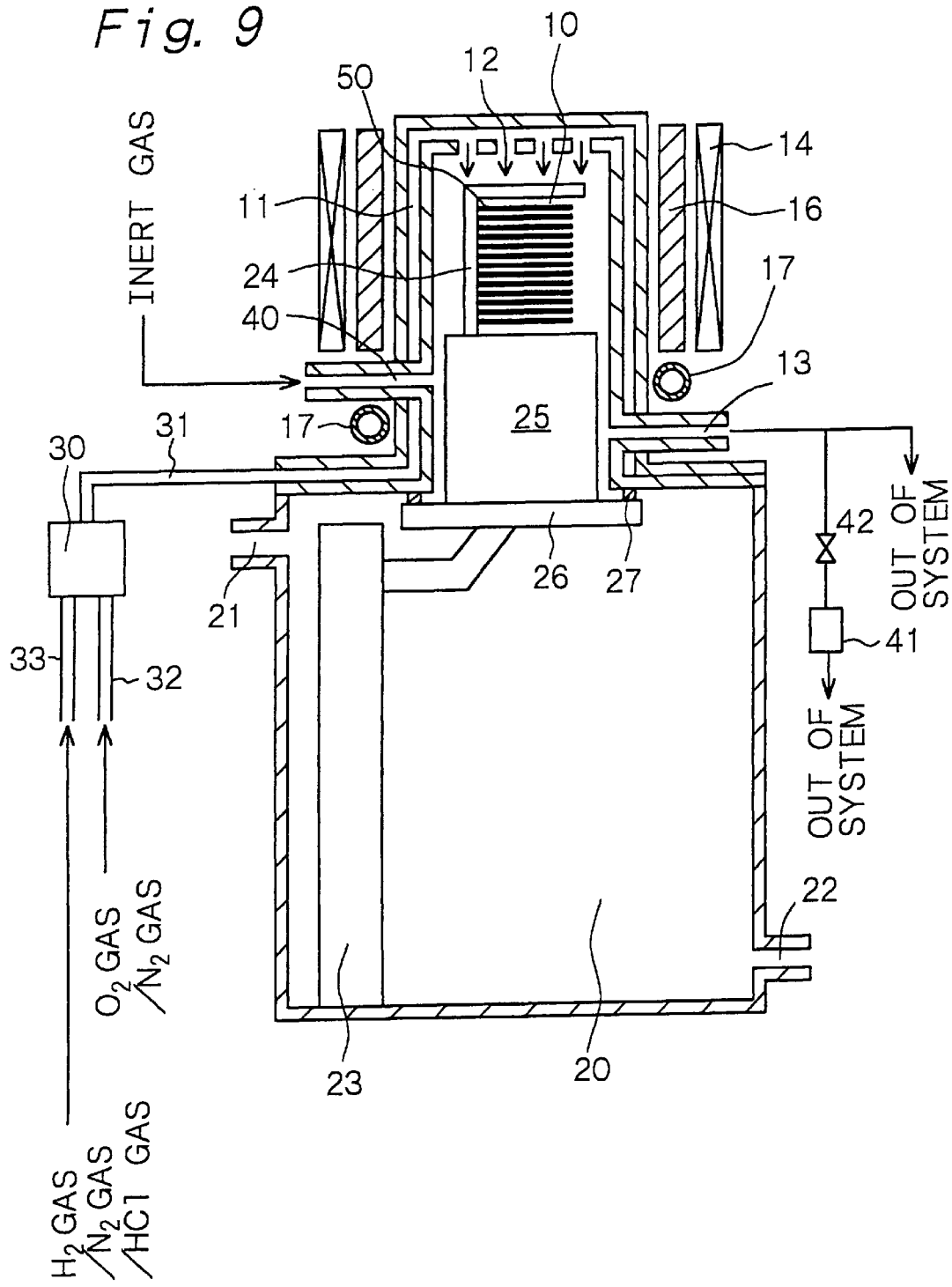
FIG. 9 is a schematic view of variant of the apparatus for forming a silicon oxide film in Example 1.

Further, as shown in FIG. 9, the dew-formation prevention/evaporation means is provided with means (specifically, a humidity sensor 41) of measuring a moisture content of the gas exhausted from the gas exhaust portion 13. The flow of the gas exhausted from the gas exhaust portion 13 is divided, and the gas which is temperature-decreased as required is measured for a moisture content with the humidity sensor 41, whereby it can be reliably determine when the substrate receiving member 24 can be moved downwardly by operating the elevator unit 23. Reference numeral 42 indicates a valve for dividing the flow of the gas exhausted from the gas exhaust portion 13.

EXAMPLE 2

Figure 10:
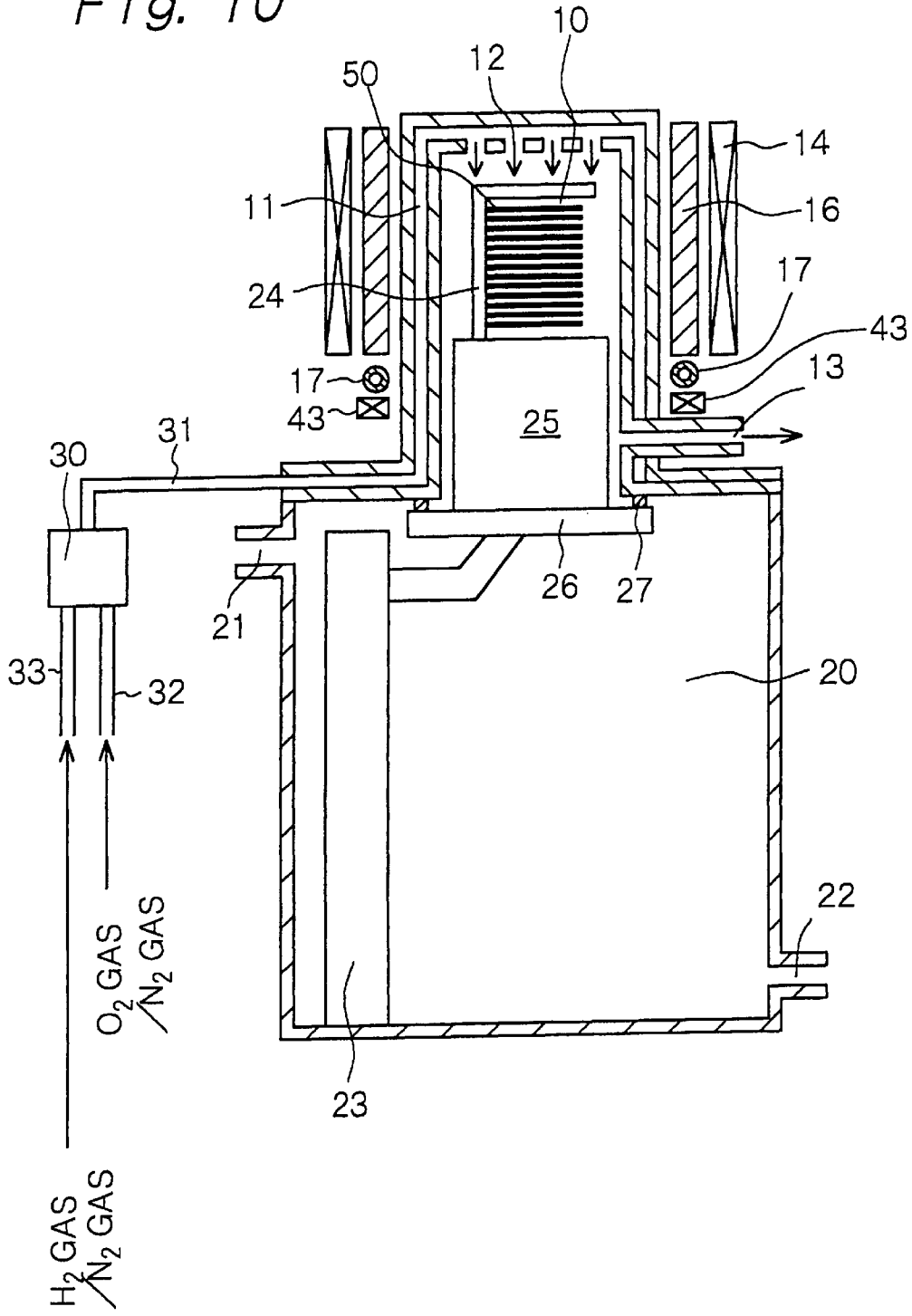
FIG. 10 is a schematic view of an apparatus for forming a silicon oxide film in Example 2.

Example 2 is also concerned with the apparatus for forming a silicon oxide film, provided by the present invention, and the method of forming a silicon oxide film according to the first aspect of the present invention. FIG. 10 schematically shows the apparatus for forming silicon oxide film in Example 2. In Example 1, the dew-formation prevention/evaporation means comprises the inert gas source, the inert gas inlet port 40 disposed in the process chamber 10, the piping connecting the inert gas inlet port 40 and the inert gas source, and the heating means for heating the inert gas to be introduced into the process chamber 10. In the apparatus for forming a silicon oxide film in Example 2, the dew-formation prevention/evaporation means comprises an auxiliary heating unit, temperature detecting means, and a control unit for controlling the auxiliary heating unit. The auxiliary heating unit, specifically, a heater 43 is disposed outside the process chamber 10 and is for heating the heat insulation member 25. The temperature detecting means is preferably a thermocouple which is attached to the surface of the heat insulation member 25 for detecting a surface temperature of the heat insulation member 25. Showing of the thermocouple and the control unit is omitted. Specifically, the heat insulation member 25 is measured for a surface temperature with the thermocouple, and on the basis of an output of the thermocouple, a power source (not shown) for supplying electric power to the heater 43 is controlled with the control unit (for example, PID controller). The heater may be according to a resistance heating method or a lamp heating method.

In Example 2, the surface temperature of the heat insulation member 25 is also controlled so as to prevent the dew-formation prevention/evaporation means from deteriorating and damaging the sealing member 27 or from causing damage on the substrate receiving unit and the elevator unit 23. Specifically, the surface (outer surface) temperature of the heat insulation member 25 is controlled to be in the range of from 100 to 150° C.

Figure 21:
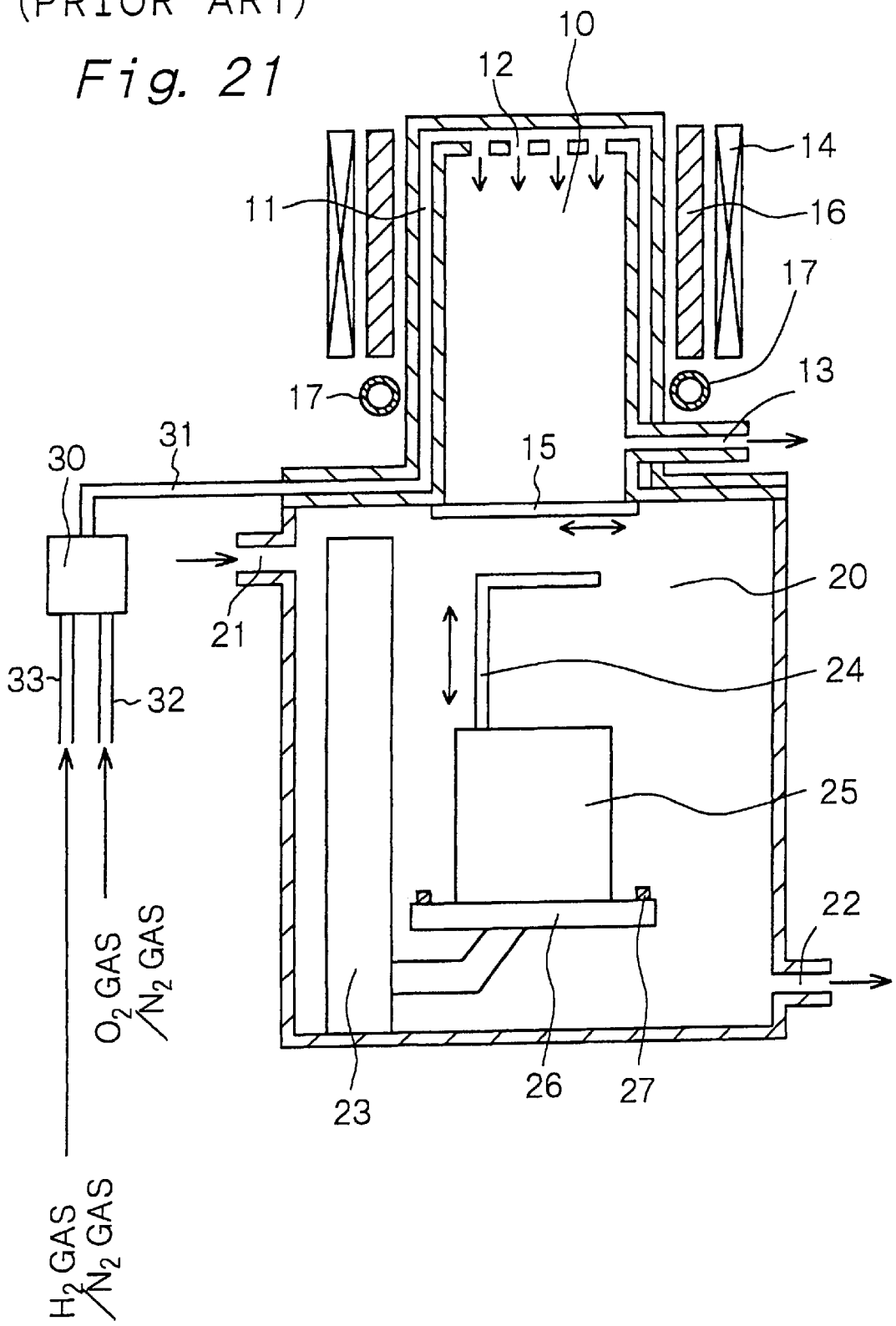
FIG. 21 is a schematic cross-sectional view of a conventional apparatus for forming a silicon oxide film (thermal oxidation furnace).
Figure 22:
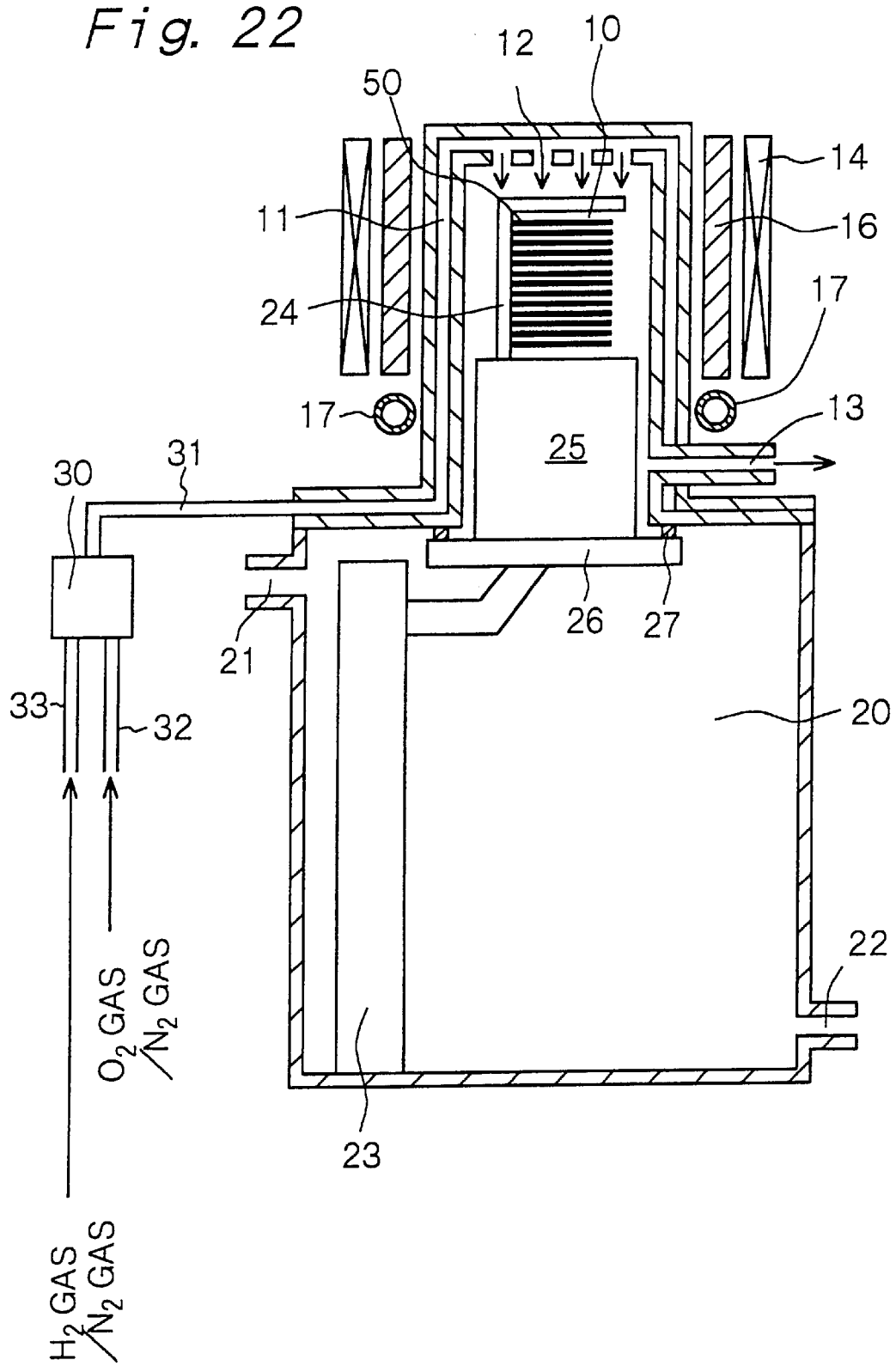
FIG. 22 schematically shows a state where silicon semiconductor substrates are transferred into a process chamber of the conventional apparatus shown in FIG. 21 and the surfaces of the silicon semiconductor substrates are thermally oxidized.
Figure 23A:
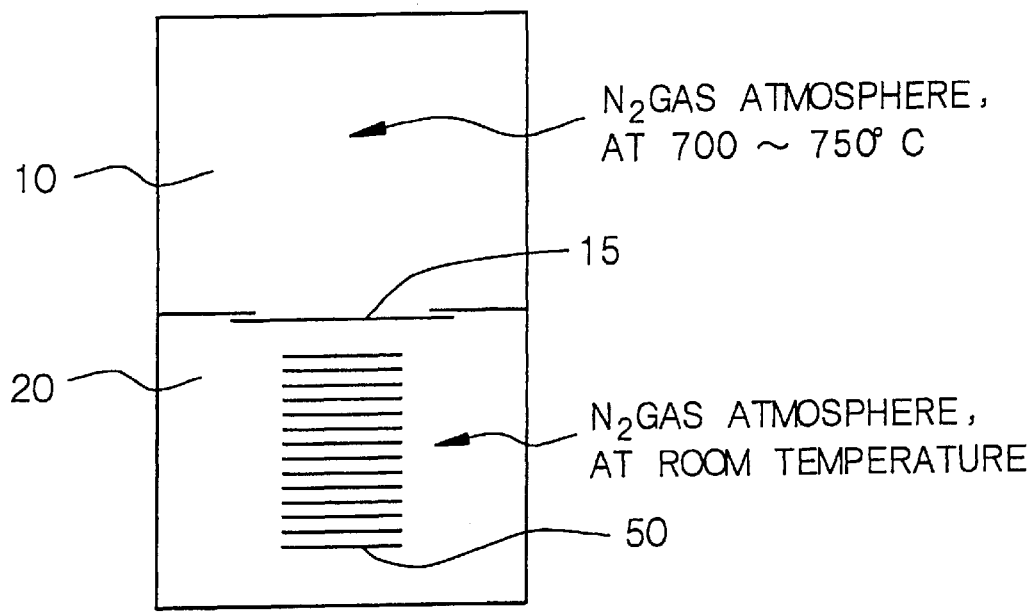
FIGS. 23A and 23B are conceptual views of an apparatus and the like for forming a silicon oxide film, for explaining a conventional method of forming a silicon oxide film.
Figure 23B:
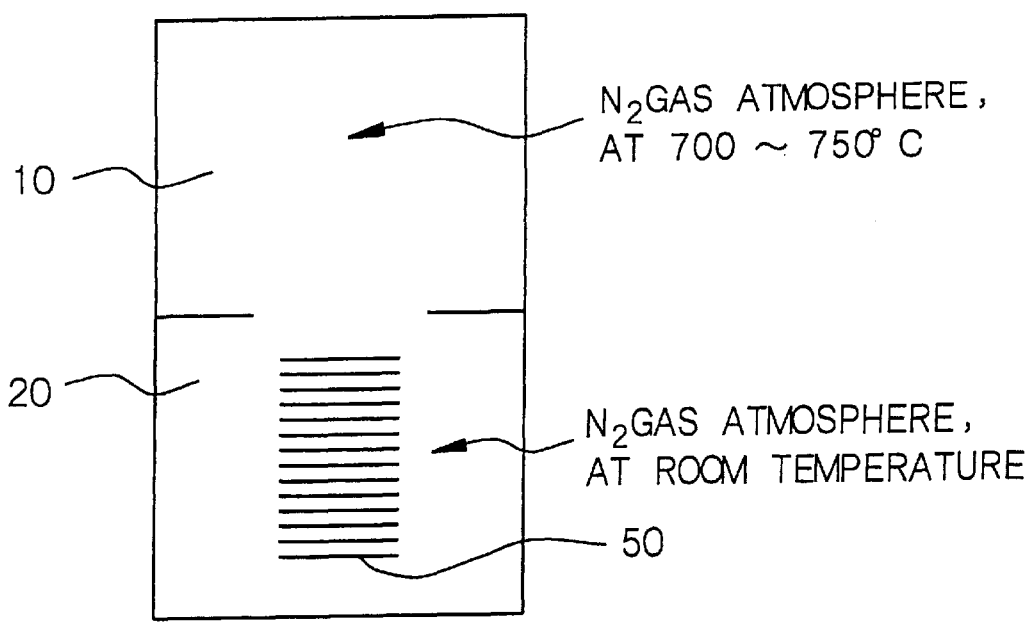
Figure 24A:
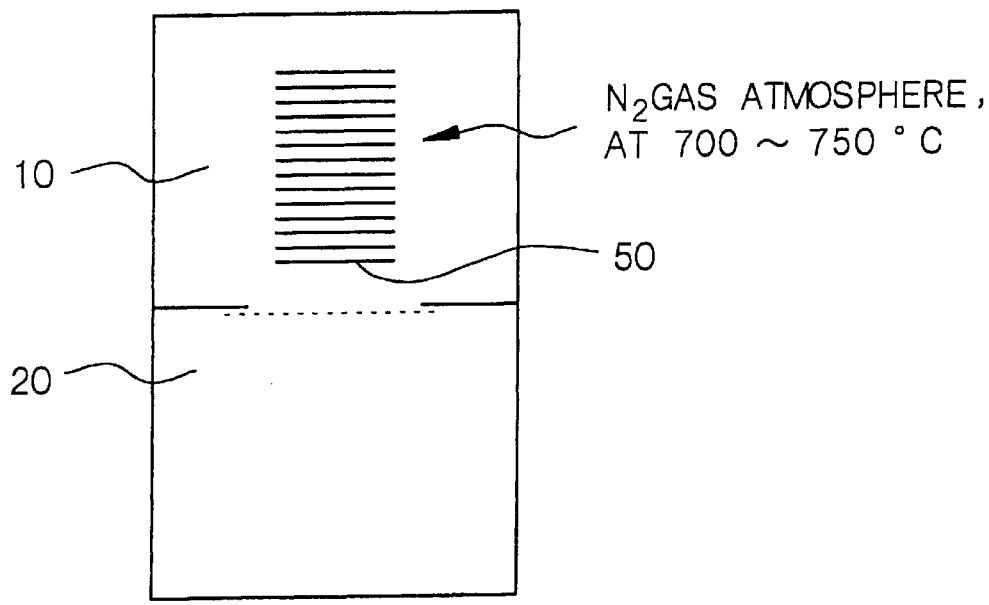
FIGS. 24A and 24B following FIG. 23B are conceptual views of the apparatus and the like for forming a silicon oxide film, for explaining the conventional method of forming a silicon oxide film.
Figure 24B:
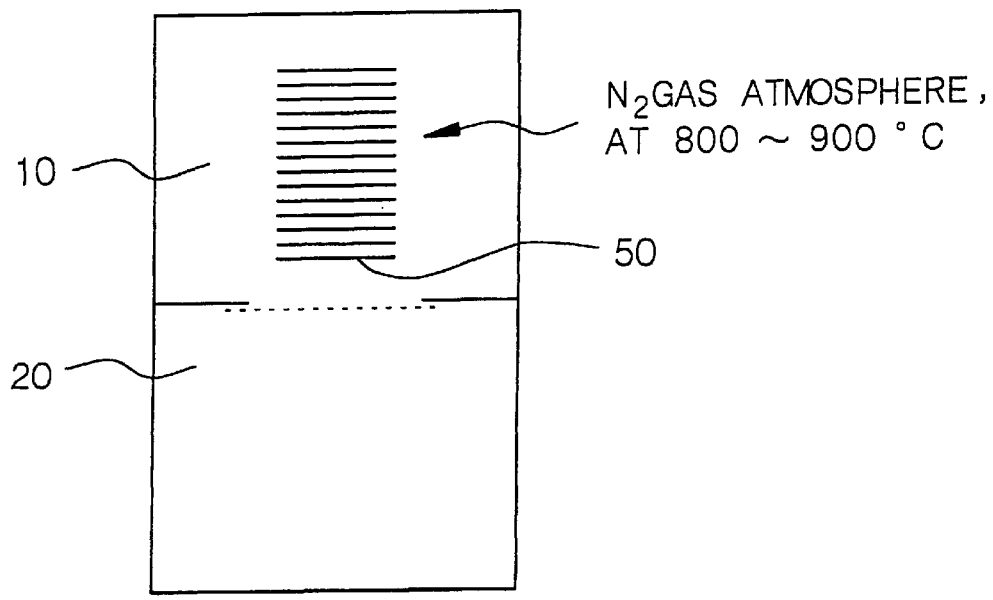
Figure 25A:
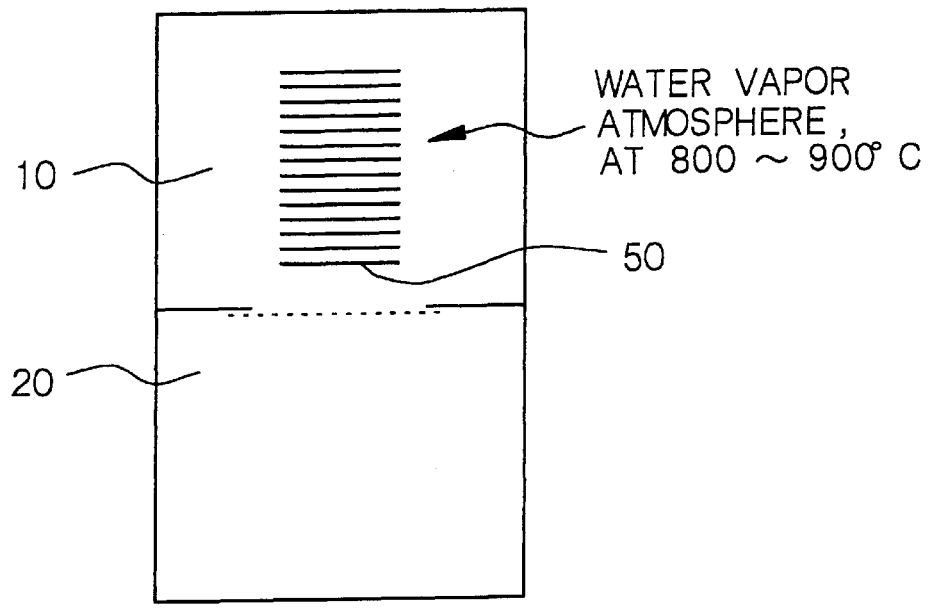
FIGS. 25A and 25B following FIG. 24B are conceptual views of the apparatus and the like for forming a silicon oxide film, for explaining the conventional method of forming a silicon oxide film.
Figure 25B:
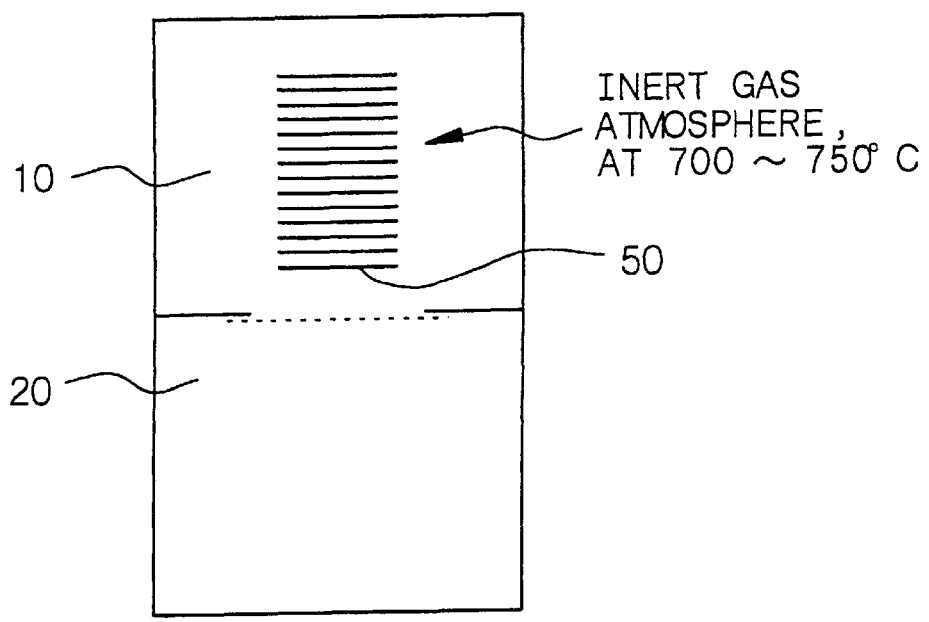

Otherwise, the auxiliary heating unit may comprise a piping and a heat medium which is to flow therein. Specifically, a conventional apparatus for forming a silicon oxide film, shown in FIG. 21, is modified, and the temperature and/or the flow rate of the heat medium to flow in the piping 17 are/is controlled, whereby the surface (outer surface) temperature of the heat insulation member 25 is controlled to be in the range of from 100 to 150° C. Specifically, the heat medium flowing the piping 17 is measured for a temperature and a flow rate, and separately, the heat insulation member 25 is measured for a surface temperature with the thermocouple. On the basis of an output of the thermocouple, the temperature and/or the flow rate of the heat medium to flow in the piping 17 can be controlled. The heat medium includes water and silicone oil.

Since a silicon oxide film can be formed by means of the apparatus in Example 2 in the same manner as in Example 1, explanations of the method of forming a silicon oxide film in Example 2 are omitted.

EXAMPLE 3

Example 3 is a variant of Example 1. In Example 3, an epitaxial silicon layer having a thickness of 10 $\mu$m is formed on a silicon semiconductor substrate by a selective epitaxial growth method. And, a silicon oxide film is formed on the surface of the above epitaxial silicon layer according to steps similar to [Step-110] to [Step-150] in Example 1. The silicon oxide film had a thickness of 2.5 nm.

EXAMPLE 4

Example 4 is a variant of Example 1. Example 4 also uses the apparatus for forming a silicon oxide film, shown in FIG. 1. In Example 2, the formation of a silicon oxide film comprises a first silicon oxide film formation step and a second silicon oxide film formation step. The first silicon oxide film formation step comprises the step of maintaining an atmosphere in an ambient temperature range in which silicon atoms are not dissociated from the surface of the silicon layer, for a predetermined period of time to carry out the thermal oxidation, after initiation of thermal oxidation of the surface of the silicon layer at an ambient temperature at which silicon atoms are not dissociated from the surface of the silicon layer. The second silicon oxide film formation step comprises the step of further thermally oxidizing the surface of the silicon oxide film at an ambient temperature higher than the ambient temperature range in which silicon atoms are not dissociated from the surface of the silicon layer, until a silicon oxide film having a predetermined thickness is obtained.

The method of forming a silicon oxide film in Example 4 by means of the apparatus shown in FIG. 1 will be explained with reference to FIGS. 11A, 11B, 12A, 12B, 13A, 13B, 14A and 14B which are conceptual views of the apparatus and the like. [Step-400]

First, an isolation region and the like are formed in a silicon semiconductor substrate in the same manner as in Example 1, and then fine particles and metal impurities are removed from the surface of the silicon semiconductor substrate by RCA cleaning. Then, the surface of the silicon semiconductor substrate is cleaned with a 0.1% hydrofluoric acid aqueous solution to expose the surface of the silicon semiconductor substrate. [Step-410]

Figure 11A:
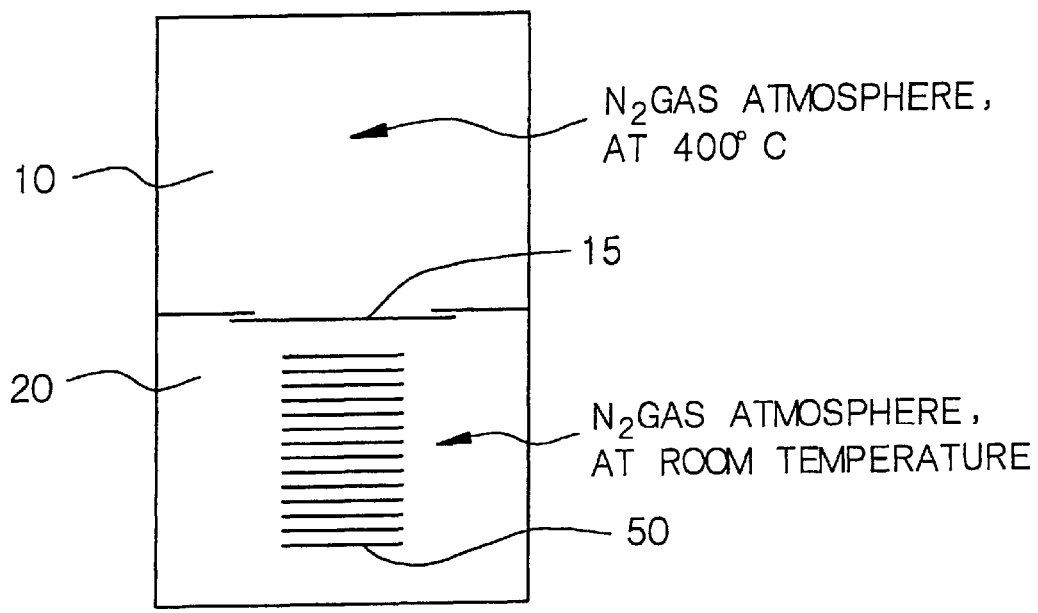
FIGS. 11A and 11B are conceptual views of an apparatus and the like for forming a silicon oxide film, for explaining a method of forming a silicon oxide film in Example 4.
Figure 11B:
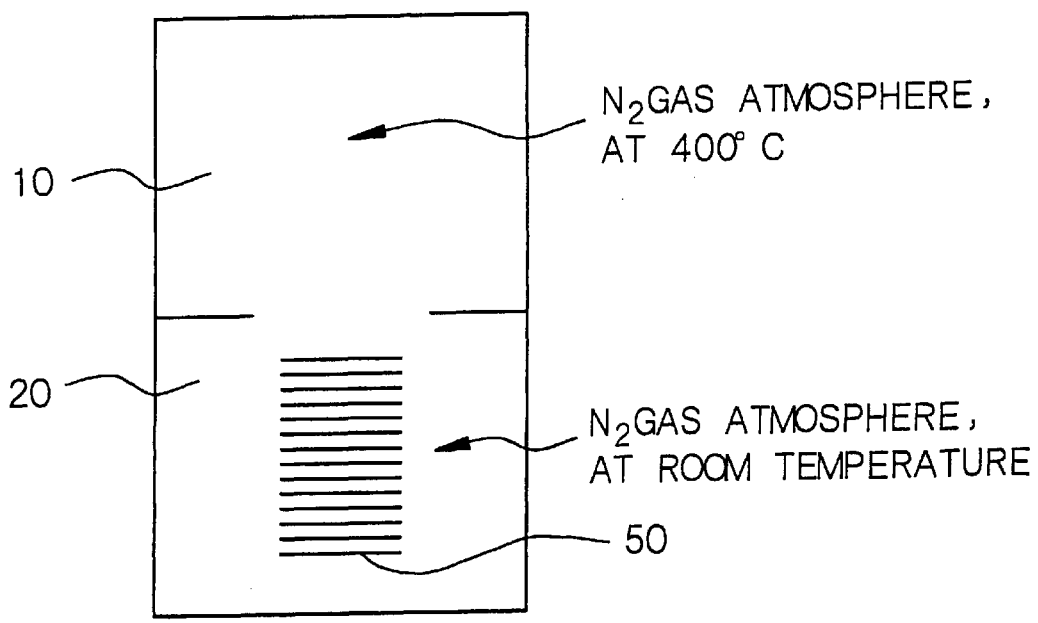
Figure 12A:
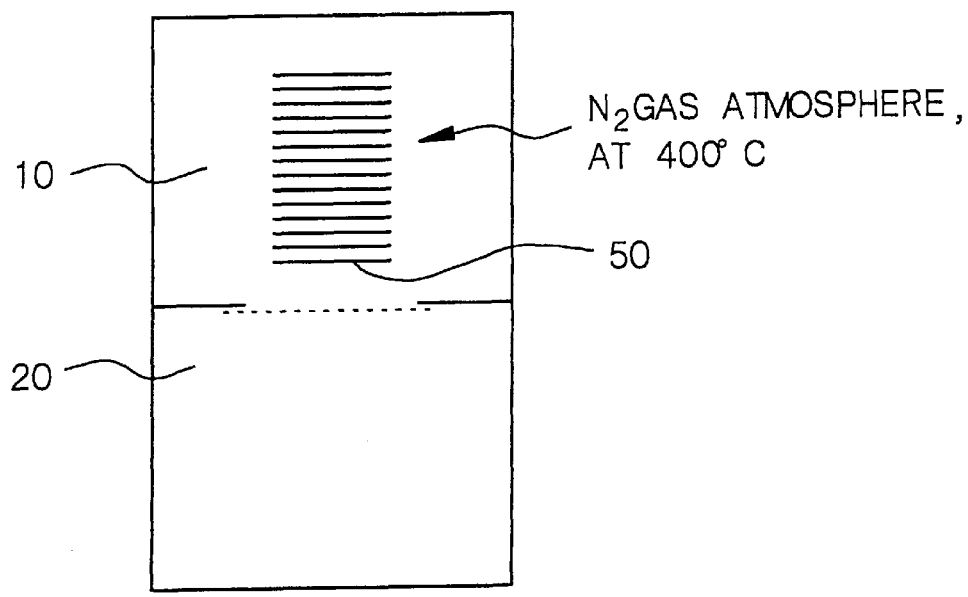
FIGS. 12A and 12B following FIG. 11B are conceptual views of the apparatus and the like for forming a silicon oxide film, for explaining the method of forming a silicon oxide film in Example 4.
Figure 12B:
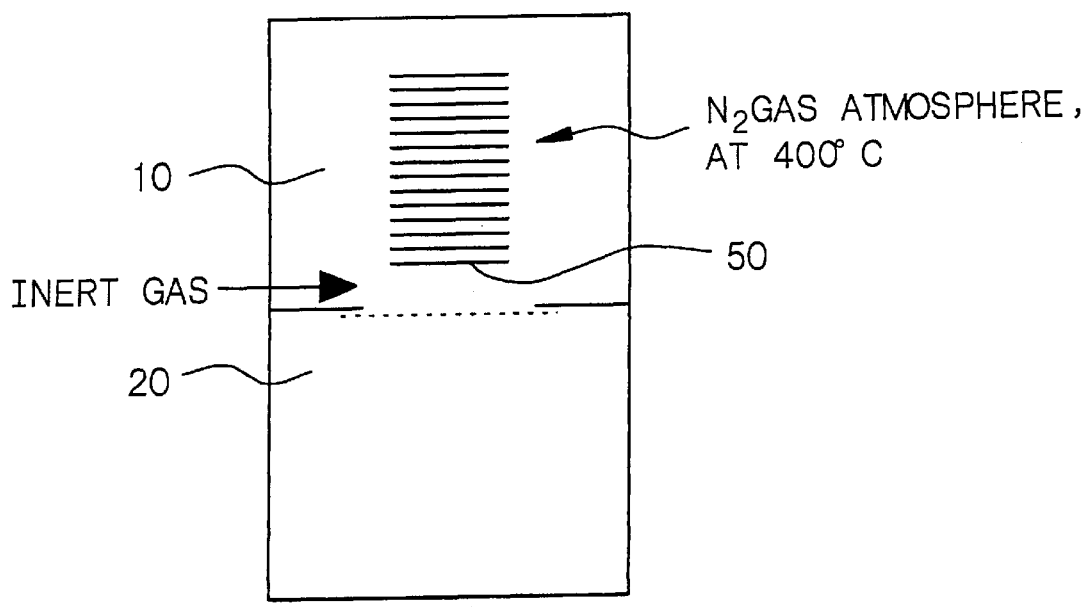

The silicon semiconductor substrates prepared in the above manner are transferred into the substrate transfer portion 20 of the apparatus shown in FIG. 1 through a door (not shown), and placed on the substrate receiving member 24 (see FIG. 11A). Nitrogen gas is introduced into the process chamber 10 through the water vapor inlet port 12 to provide an inert gas atmosphere such as a nitrogen gas atmosphere in the process chamber 10 (it may be an atmosphere under reduced pressure). In Example 4, an ambient temperature in the process chamber is maintained at 400° C. with the heater 14. Further, coolant is flowed in the piping 17. In this state, the shutter 15 is kept closed. [Step-420]

After the transfer of the silicon semiconductor substrates 50 into the substrate transfer portion 20 is completed, the door (not shown) is closed, nitrogen gas is introduced into the substrate transfer portion 20 through the gas introducing portion 21 and exhausted through the gas exhaust portion 22 to provide a nitrogen gas atmosphere in the substrate transfer portion 20. An oxygen gas concentration in the substrate transfer portion 20 is monitored, and when the oxygen gas concentration comes to be, for example, 100 ppm or less, it is judged that a sufficient nitrogen gas atmosphere is provided in the substrate transfer portion 20. Then, while coolant is flowed inside the base portion 26, the shutter 15 is opened (see FIG. 11B), and the elevator unit 23 is operated to move the substrate receiving member 24 upwardly (elevation rate: 250 mm/minute), whereby the silicon semiconductor substrates 50 are transferred into the double-tubular-structured process chamber 10 made of quartz (see FIG. 12A). When the elevator unit 23 reaches its uppermost position, the process chamber 10 and the substrate transfer portion 20 are no longer communicated with each other with the base portion 26 of the substrate receiving member 24. Since the ambient temperature in the process chamber 10 is maintained at 400° C. with the heater 14, that is, since the inside of the process chamber 10 is maintained at an ambient temperature at which silicon atoms are not dissociated from the surface of the silicon layer, the occurrence of surface roughening of the silicon semiconductor substrates 50 can be prevented. [Step-430]

Then, nitrogen gas as the inert gas is introduced into the process chamber 10 from the inert gas source through the piping and the inert gas inlet port 40. The heating means for heating the inert gas is controlled to give a surface temperature of 120° C. on the heat insulation member 25 (see FIG. 12B). The flow rate of the nitrogen gas is set at 5 SLM. [Step-420] and [Step-430] may be exchanged. [Step-440]

Then, the water vapor is introduced into the process chamber 10 through the water vapor inlet port 12 at the ambient temperature at which silicon atoms are not dissociated from the surface of the silicon layer, to initiate the thermal oxidation of the surface of the silicon layer. After initiating the formation of the silicon oxide film on the surface of the silicon layer at the above ambient temperature by the thermal oxidation method using water vapor, the first silicon oxide film formation step of maintaining the atmosphere in an ambient temperature range in which silicon atoms are not dissociated from the surface of the silicon layer, for a predetermined period, is carried out to form the silicon oxide film. Specifically, in a state where the ambient temperature is maintained at a temperature at which silicon atoms are not dissociated from the surface of the silicon layer (silicon semiconductor substrate 50 in Example 4) (specifically the ambient temperature is set at 400° C. in Example 4), silicon oxide film is formed on the surface of the silicon layer by the thermal oxidation method using water vapor. In Example 4, oxygen gas and hydrogen gas are supplied to the combustion chamber 30 through the pipings 32 and 33, and the water vapor generated in the combustion chamber 30 is introduced into the process chamber 10 through the piping 31, the gas flow passage 11 and the water vapor inlet port 12, to form the silicon oxide film having a thickness of 1.2 nm each on the surfaces of the silicon semiconductor substrates 50 by a pyrogenic oxidation method (see FIG. 13A). The above thickness of the silicon oxide film corresponds to a thickness of a few molecular layers of $SiO_2$ and is sufficient for the silicon oxide film to work as a protective layer even if steps on the surface of the silicon semiconductor substrate are considered. Since the inert gas is continuously introduced into the process chamber 10 through the inert gas inlet port 40, dew formation on the surface of the heat insulation 10 member 25 can be reliably prevented. [Step-450]

Figure 13A:
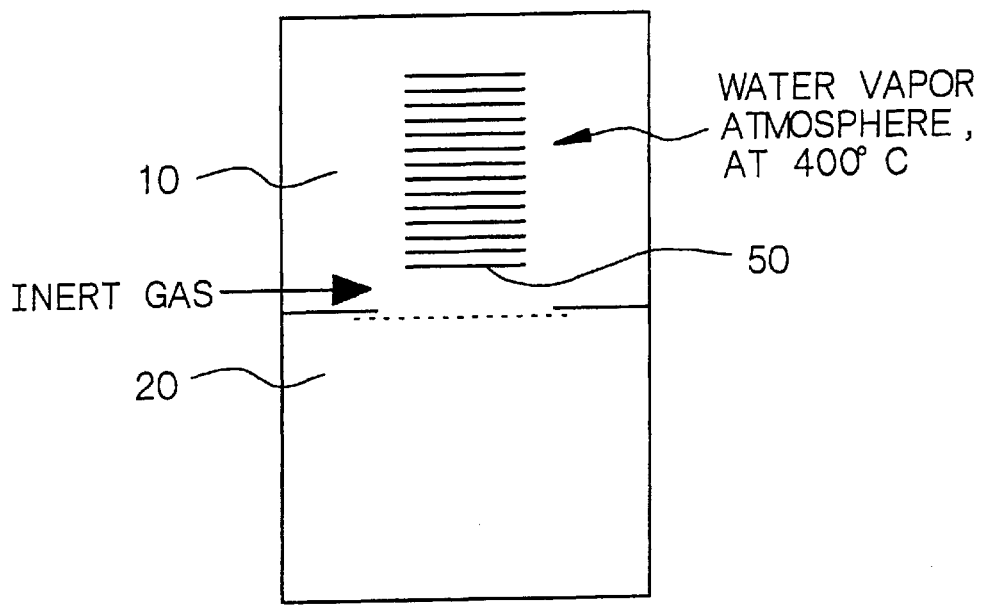
FIGS. 13A and 13B following FIG. 12B are conceptual views of the apparatus and the like for forming a silicon oxide film, for explaining the method of forming a silicon oxide film in Example 4.
Figure 13B:
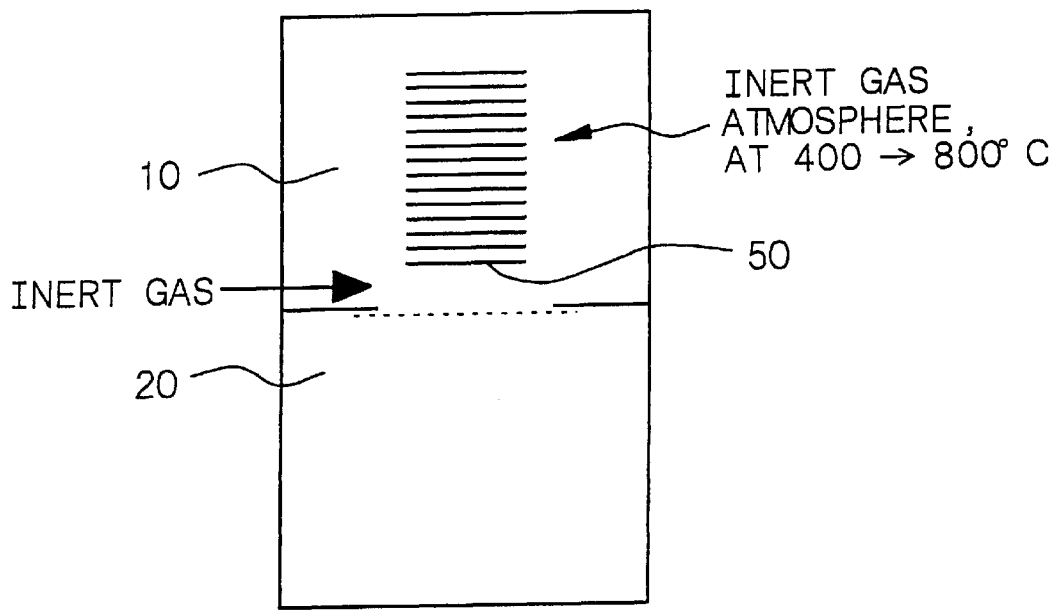
Figure 14A:
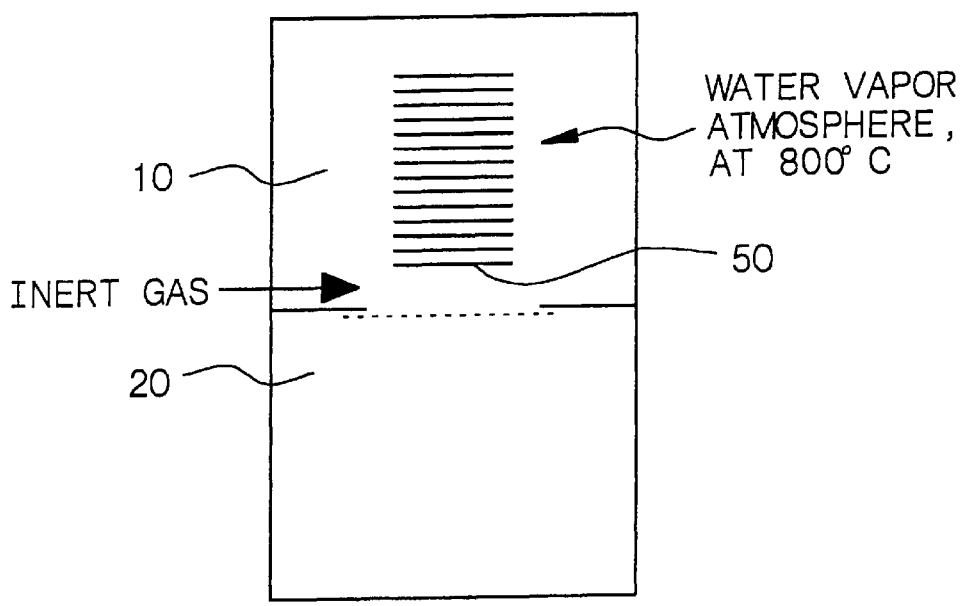
FIGS. 14A and 14B following FIG. 13B are conceptual views of the apparatus and the like for forming a silicon oxide film, for explaining the method of forming a silicon oxide film in Example 4.
Figure 14B:
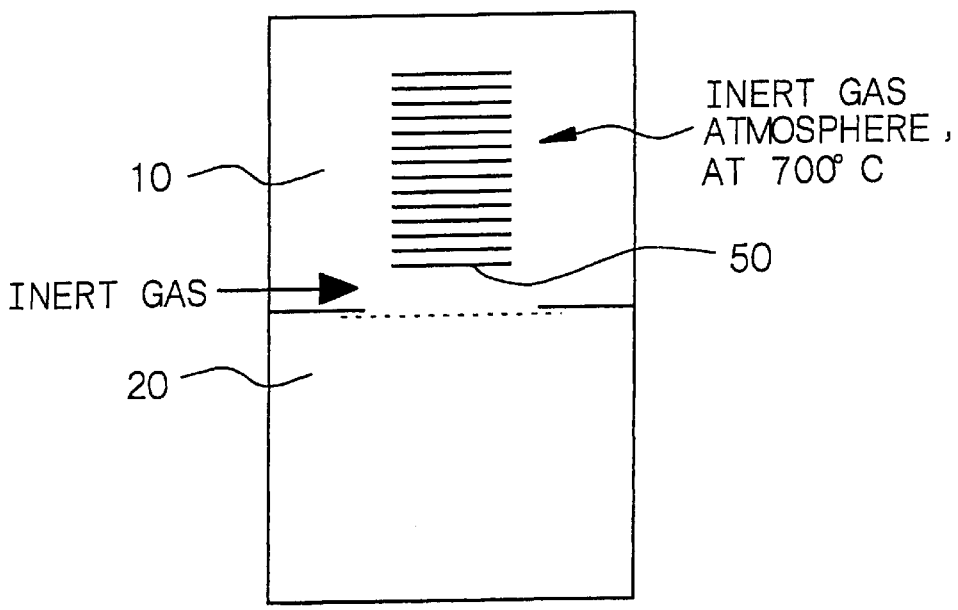

Then, the introduction of the water vapor into the process chamber 10 is discontinued, and while inert gas is introduced into the process chamber 10 through the piping 32, the combustion chamber 30, the piping 31, the gas flow passage 11 and the water vapor inlet port 12, the ambient temperature in the process chamber 10 of the apparatus is increased up to 800° C. with the heater 14 through the heat equalizer tube 16 (see FIG. 13B). The temperature increase rate is set at 10° C./minute. Since the silicon oxide film which works as a protective layer is already formed on the surface of the silicon layer in [Step-440], the surface of the silicon layer (silicon semiconductor substrate 50) is not roughened in [Step-450]. The introduction of the inert gas into the process chamber 10 through the inert gas inlet port 40 is continued. [Step-460]

After the ambient temperature in the process chamber 10 reaches an ambient temperature (800° C. in Example 4) which is higher than the ambient temperature at which silicon atoms are not dissociated from the surface of the silicon layer, while the above ambient temperature is maintained, the second silicon oxide film formation step of further forming a silicon oxide film is carried out by a thermal oxidation method using water vapor. Specifically, oxygen gas and hydrogen gas are again supplied to the combustion chamber 30 through the pipings 32 and 33, and the water vapor generated in the combustion chamber 30 is introduced into the process chamber 10 through the piping 31, the gas flow passage 11 and the water vapor inlet port 12, to form the silicon oxide film having a total thickness of 4.0 nm each on the surfaces of the silicon semiconductor substrates 50 by a pyrogenic oxidation method (see FIG. 14A). When the formation of the silicon oxide film having a predetermined thickness is completed, the ambient temperature (800° C. in Example 4 is higher than the ambient temperature (400° C. in Example 4) employed when the formation of the silicon oxide film on the surface of the silicon layer is initiated. Since the introduction of the inert gas into the process chamber 10 through the inert gas inlet port 40 is continued, dew formation on the heat insulation member 25 can be reliably prevented. [Step-470]

Then, the supply of the water vapor into the process chamber 10 is terminated, and nitrogen gas is introduced into the process chamber 10 through the water vapor inlet port 12 to provide an inert gas atmosphere (temperature: 700° C.) in the process chamber 10. That is, the atmosphere in the process chamber 10 is replaced with inert gas to remove the water vapor out of the process chamber 10. The nitrogen gas as the inert gas is continuously introduced into the process chamber 10 from the inert gas source through the piping and the inert gas inlet port 40 (see FIG. 14B). When a predetermined period of time passes after the termination of supply of the water vapor to the process chamber 10, the elevator unit 23 is operated to move the substrate receiving member 24 downwardly, the shutter 15 is closed, and the silicon semiconductor substrates 50 are transferred out of the substrate transfer portion 20.

When it is intended to form a silicon oxide film having still higher characteristics, it is preferred to heat-treat the silicon oxide film as explained below. That is, after [Step-460], there is provided a state where no dew is formed on the surface of the heat insulation member 25, or dew on the surface of the heat insulation member 25 is evaporated. Then, an atmosphere in the process chamber 10 is replaced with inert gas to remove water vapor from the process chamber 10. Then, nitrogen gas containing 0.15% by volume of hydrogen chloride gas (hydrogen chloride gas: 15 SCCM/nitrogen gas: 10 SLM) is introduced into the process chamber 10 through the water vapor inlet port 12, and heat treatment is carried out at an ambient temperature of 750° C. for 30 minutes. Thereafter, a nitrogen gas atmosphere is provided in the process chamber 10, and the elevator unit 23 is operated to move the substrate receiving member 24 downwardly. Then, the silicon semiconductor substrates 50 are transferred out of the substrate transfer portion 20. Otherwise, after [Step-470], the formed silicon oxide films may be heat-treated as follows. The silicon semiconductor substrates 50 having silicon oxide films formed on their surfaces are transferred into the process chamber 10A of the heat treatment apparatus which is schematically shown in FIG. 8. A nitrogen gas atmosphere having a temperature of 700° C. is provided in the process chamber 10A in advance. After completion of transfer of the silicon semiconductor substrates 50 into the process chamber 10A, the ambient temperature in the process chamber 10A is increased up to 800° C. at a rate of 5° C./minute, and then, the atmosphere in the process chamber 10A is replaced with an inert gas atmosphere containing halogen element (for example, nitrogen gas atmosphere containing 0.1% by volume of hydrogen chloride and having a temperature of 800° C., in which hydrogen chloride gas: 10 SCCM/nitrogen gas: 10 SLM), to heat-treat the formed silicon oxide films for 30 minutes.

EXAMPLE 5

Figure 15:
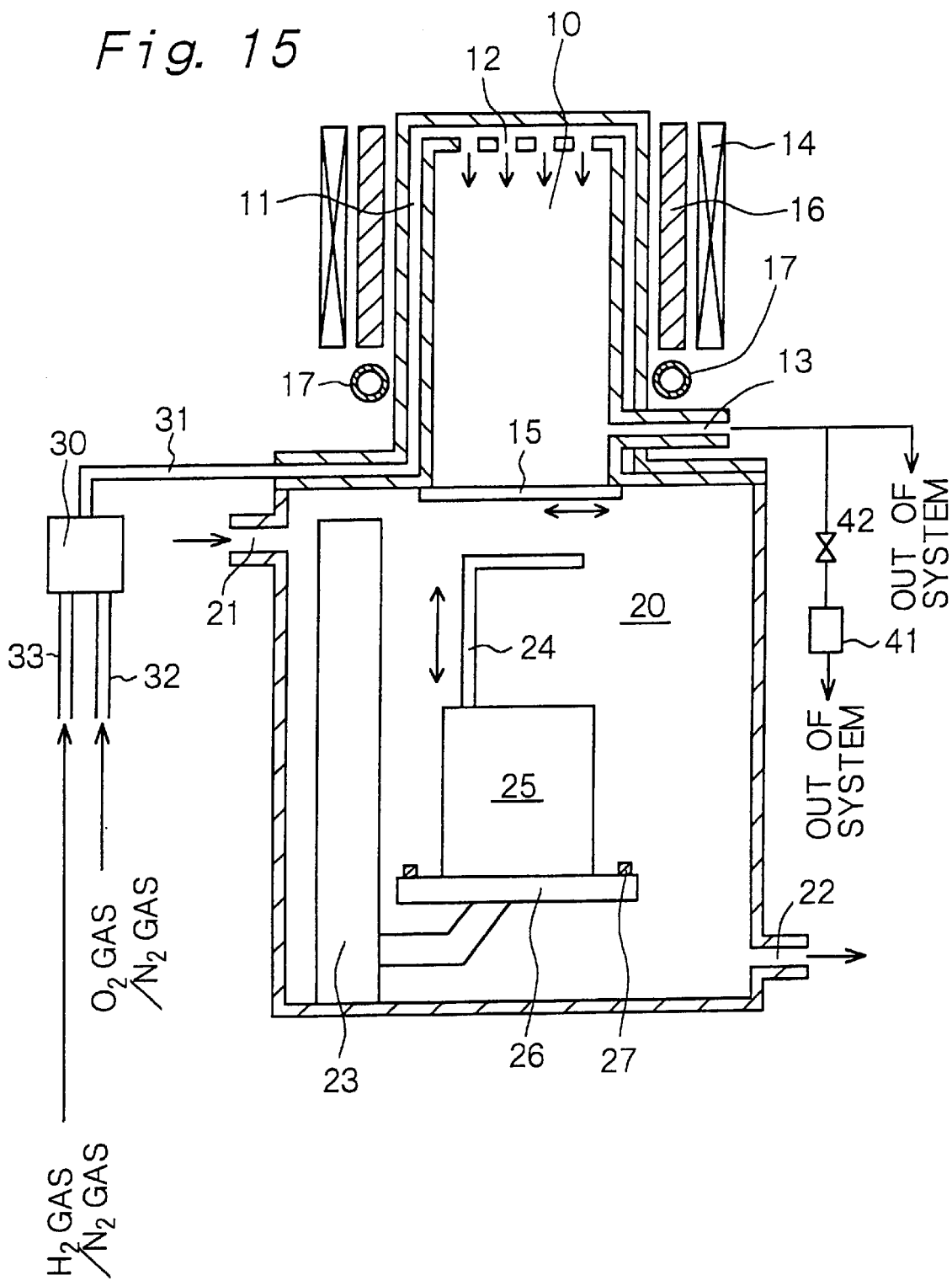
FIG. 15 is a schematic view of an apparatus for forming a silicon oxide film, used in Example 5.

Example 5 is concerned with the method of forming a silicon oxide film according to the second aspect of the present invention. FIG. 15 shows a schematic view of an apparatus for forming a silicon oxide film, which is suitable for carrying out the method of forming a silicon oxide film in Example 5. This apparatus is prepared by modifying a conventional apparatus, for example, shown in FIG. 21. The apparatus 10 has means (specifically, a humidity sensor 41) for measuring a moisture content of the gas exhausted from the gas exhaust portion 13. Also, flow of the gas exhausted from the gas exhaust portion 13 is divided, and the gas which is temperature-decreased as required 15 is measured for a moisture content with the humidity sensor 41. Reference numeral 42 indicates a valve for dividing the flow of the gas exhausted from the gas exhaust portion 13. In the above embodiment, it can be reliably determine whether or not water vapor and dew in the process chamber 10 are discharged from the process chamber 10.

The method of forming a silicon oxide film by means of the apparatus shown in FIG. 15 in Example 5 will be explained with reference to FIGS. 16A, 16B, 17A, 25 17B, 18A and 18B which are conceptual views of the apparatus. In Example 5, the ambient temperature in the process chamber 10 during the thermal oxidation of the surface of the silicon layer and the ambient temperature in the process chamber 10 in the removal of water vapor and dew out of the process chamber 10 are set at a nearly equal temperature. [Step-500]

First, an isolation region and the like are formed in a silicon semiconductor substrate in the same manner as in Example 1, and then fine particles and metal impurities are removed from the surface of the silicon semiconductor substrate by RCA cleaning. Then, the surface of the silicon semiconductor substrate is cleaned with a 0.1% hydrofluoric acid aqueous solution to expose the surface of the silicon semiconductor substrate. [Step-510]

Figure 16A:
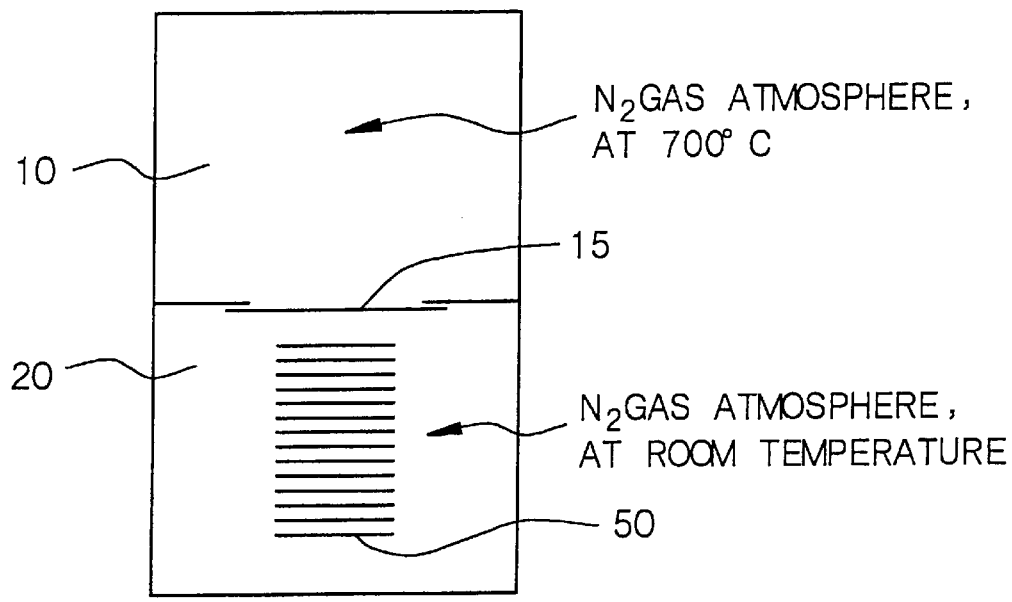
FIGS. 16A and 16B are conceptual views of the apparatus and the like for forming a silicon oxide film, for explaining the method of forming a silicon oxide film in Example 5.
Figure 16B:
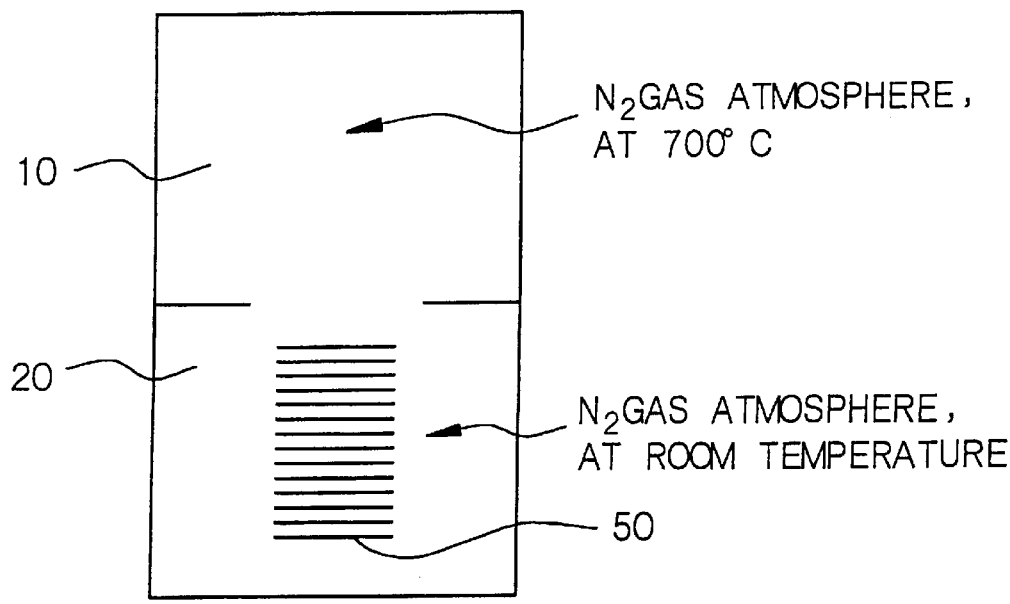
Figure 17A:
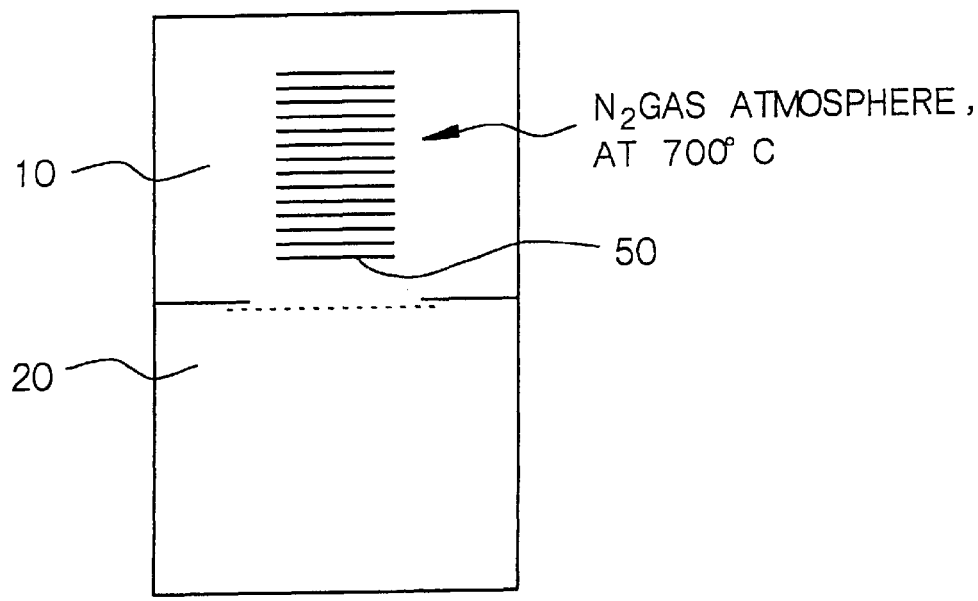
FIGS. 17A and 17B following FIG. 16B are conceptual views of the apparatus and the like for forming a silicon oxide film, for explaining the method of forming a silicon oxide film in Example 5.
Figure 17B:
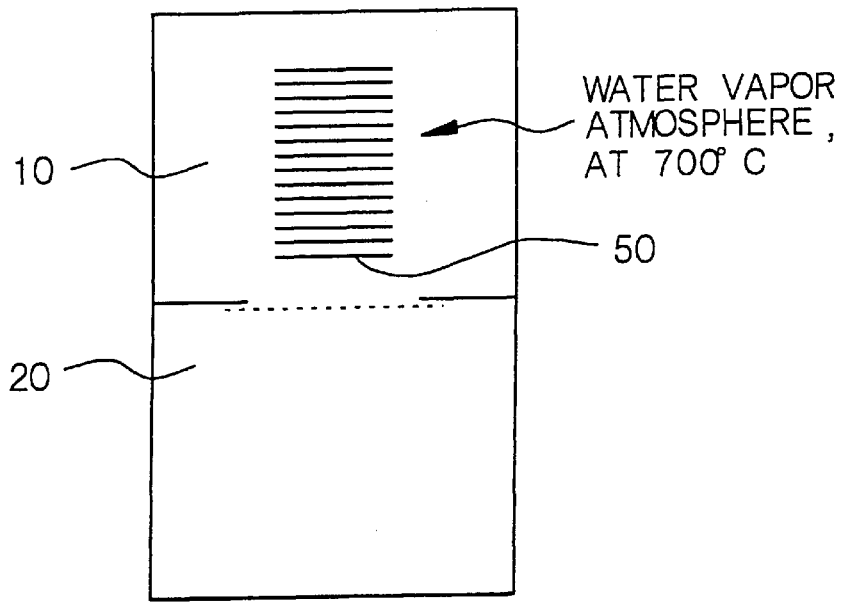

The silicon semiconductor substrates prepared in the above manner are transferred into the substrate transfer portion 20 of the apparatus shown in FIG. 15 through a door (not shown), and placed on the substrate receiving member 24 (see FIG. 16A). Nitrogen gas is introduced into the process chamber 10 through the water vapor inlet port 12 to provide an inert gas atmosphere such as a nitrogen gas atmosphere in the process chamber 10 (it may be an atmosphere under reduced pressure). And, an ambient temperature in the process chamber 10 is maintained at 700° C. with the heater 14 through the heat equalizer tube 16. Further, coolant flows in the piping 17. In this state, the shutter 15 is kept closed. [Step-520]

After the transfer of the silicon semiconductor substrates 50 into the substrate transfer portion 20 is completed, the door (not shown) is closed, and nitrogen gas is introduced into the substrate transfer portion 20 through the gas introducing portion 21 and exhausted through the gas exhaust portion 22 to provide a nitrogen gas atmosphere in the substrate transfer portion 20. An oxygen gas concentration in the substrate transfer portion 20 is monitored, and when the oxygen gas concentration comes to be, for example, 100 ppm or less, it is judged that a sufficient nitrogen gas atmosphere is provided in the substrate transfer portion 20. Then, while coolant is flowed inside the base portion 26, the shutter 15 is opened (see FIG. 16B), and the elevator unit 23 is operated to move the substrate receiving member 24 upwardly (elevation rate: 50 mm/minute), whereby the silicon semiconductor substrates 50 are transferred into the double-tubular-structured process chamber 10 made of quartz (see FIG. 17A). When the elevator unit 23 reaches its uppermost position, the process chamber 10 and the substrate transfer portion 20 are no longer communicated with each other with the base portion 26 of the substrate receiving member 24. [Step-530]

After the ambient temperature in the process chamber 10 is fully stabilized at 700° C., oxygen gas (flow rate: 10 SLM) and hydrogen gas (flow rate: 10 SLM) are supplied to the combustion chamber 30 through the pipings 32 and 33, and the oxygen gas and the hydrogen gas are mixed at a high temperature in the combustion chamber 30 to combust the hydrogen. Formed water vapor is introduced into the process chamber 10 through the piping 31, the gas flow passage 11 and the water vapor inlet port 12, and exhausted through the gas exhaust portion 13 (see FIG. 17B), whereby the surface of the silicon layer is thermally oxidized. That is, a silicon oxide film is formed on the surface of each of the silicon semiconductor substrates 50. The temperature in the combustion chamber 30 is maintained at 700 to 900° C., with, for example, a heater (not shown). During the formation of the silicon oxide film, the heat insulation member 25 frequently has a temperature of less than 100° C., and dew is formed on the surface of the heat insulation member 25. [Step-540]

Figure 18A:
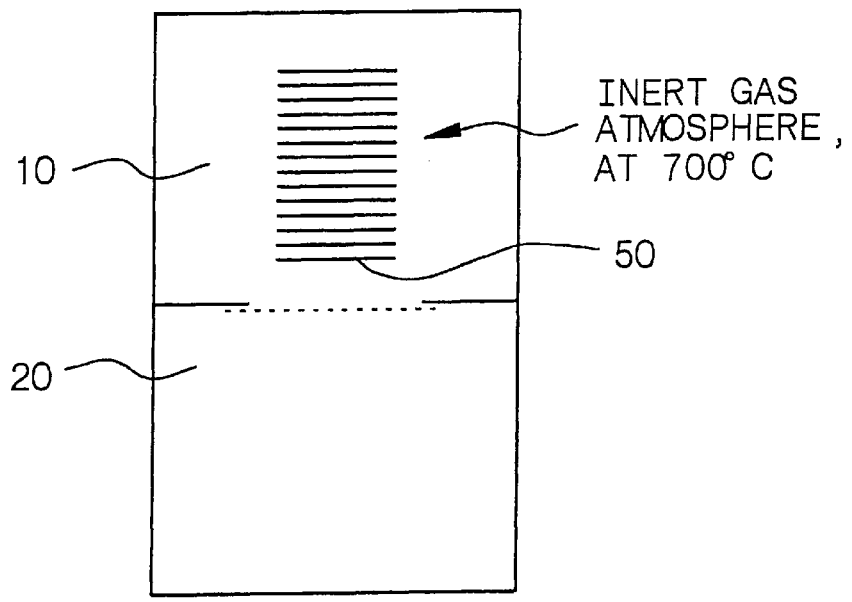
FIGS. 18A and 18B following FIG. 17B are conceptual views of the apparatus and the like for forming a silicon oxide film, for explaining the method of forming a silicon oxide film in Example 5.
Figure 18B:
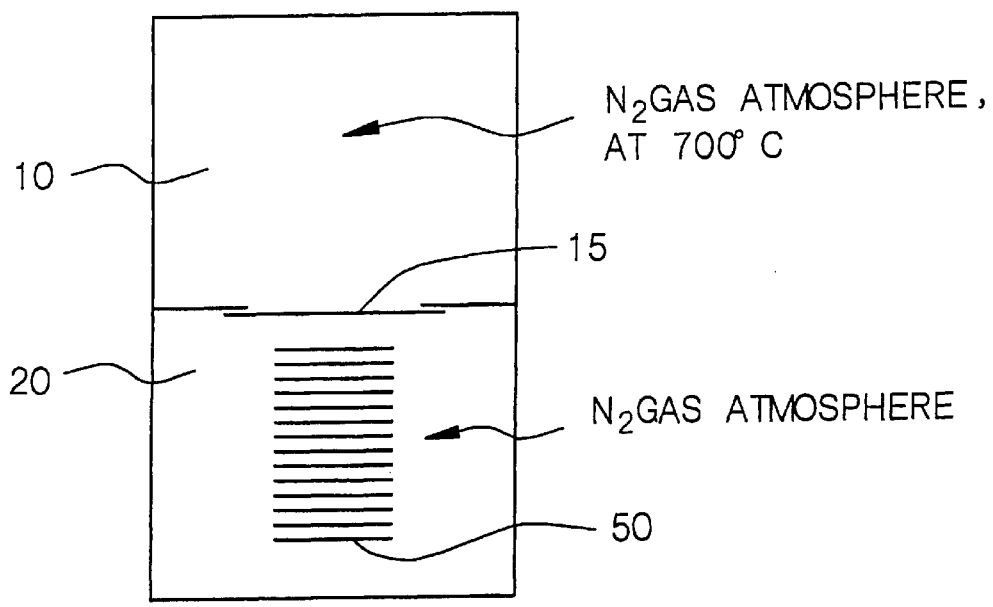

After the formation of the silicon oxide films having a thickness of, for example, approximately 2.0 nm, the supply of the water vapor into the process chamber 10 is terminated, and nitrogen gas (flow rate: 10 SLM) is introduced into the process chamber 10 through the water vapor inlet port 12, to replace the atmosphere in the process chamber 10 with an inert gas atmosphere (temperature: 700° C.) such as a nitrogen gas atmosphere (see FIG. 18A). After the termination of supply of the water vapor into the process chamber 10, the valve 42 is opened, and the gas exhausted from the gas exhaust portion 13 is measured for a moisture content with the humidity sensor 41. When the moisture content in the gas comes to be 0.02 kg or less per kilogram of dry inert gas, it can be judged that water vapor and dew in the process chamber 10 (specifically, water vapor in the process chamber 10 and dew on the surface of the heat insulation member 25) are removed. In Example 5, the nitrogen gas is continuously introduced into the process chamber 10 through the water vapor inlet port 12 for 15 minutes. [Step-550]

Then, the silicon semiconductor substrates 50 as substrates are transferred out of the process chamber 10. That is, the elevator unit 23 is operated to move the substrate receiving member 24 downwardly, the shutter 15 is closed (see FIG. 18B), and the silicon semiconductor substrates 50 are transferred out of the substrate transfer portion 20.

In the apparatus for forming a silicon oxide film by thermally oxidizing a silicon wafer having a diameter of 8 inches, generally, the atmosphere in the process chamber 10 can be replaced with nitrogen gas by introducing 10 SLM to 15 SLM of nitrogen gas into the process chamber 10 through the water vapor inlet port 12 for approximately 1 minute. However, when the silicon semiconductor substrates 50 were transferred out of the process chamber 10 in the above state, it was found that dew existed on the surface of the heat insulation member 25. When the silicon semiconductor substrates 50 were transferred out of the process chamber 10 after 10 SLM to 15 SLM of nitrogen gas was introduced into the process chamber 10 through the water vapor inlet port 12 for approximately 3 minutes, it was also found that dew similarly existed on the surface of the heat insulation member 25.

When it is intended to form a silicon oxide film having still higher characteristics, it is preferred to heat-treat the formed silicon oxide film as explained below. That is, after [Step-540], nitrogen gas containing 0.15% by volume of hydrogen chloride gas (hydrogen chloride gas: 15 SCCM/nitrogen gas: 10 SLM) is introduced into the process chamber 10 through the water vapor inlet port 12 in a state where the ambient temperature in the process chamber 10 is maintained at 700° C., and heat treatment is carried out for 30 minutes. Thereafter, a nitrogen gas atmosphere is provided in the process chamber 10, and the elevator unit 23 is operated to move the substrate receiving member 24 downwardly. Then, the silicon semiconductor substrates 50 are transferred out of the substrate transfer portion 20.

Otherwise, after [Step-550], as required, the formed silicon oxide films may be heat-treated as follows. The silicon semiconductor substrates 50 having silicon oxide films formed on their surfaces are transferred into the process chamber 10A of the heat treatment apparatus which is schematically shown in FIG. 8. A nitrogen gas atmosphere having a temperature of 700° C. is provided in the process chamber 10A in advance. After completion of the transfer of the silicon semiconductor substrates 50 into the process chamber 10A, the ambient temperature in the process chamber 10A is increased up to 800° C. at a rate of 5°C./minute, and then, the atmosphere in the process chamber 10A is replaced with an inert gas atmosphere containing halogen element (for example, nitrogen gas atmosphere containing 0.1% by volume of hydrogen chloride and having a temperature of 800° C., in which hydrogen chloride gas: 10 SCCM/nitrogen gas: 10 SLM), to heat-treat the formed silicon oxide films for 30 minutes.

In the method of forming a silicon oxide film, explained in Example 5, the formation of the silicon oxide film may comprise the method of forming a silicon oxide film, explained in Example 4. More specifically, the first silicon oxide film formation step of initiating the thermal oxidation of the surface of the silicon layer at an ambient temperature at which silicon atoms are not dissociated from the surface of the silicon layer and then maintaining the atmosphere for a predetermined period of time in an ambient temperature range in which silicon atoms are not dissociated from the surface of the silicon layer, to carry out the thermal oxidation. The step is followed by the second silicon oxide film formation step of further thermally oxidizing the surface of the silicon oxide film at an ambient temperature higher than the ambient temperature range in which silicon atoms are not dissociated from the surface of the silicon layer, until a silicon oxide film having a predetermined thickness is obtained. In this case, after completion of the second silicon oxide film formation step, the atmosphere in the process chamber 10 is replaced with an inert gas atmosphere to remove water vapor and dew in the process chamber 10 out of the process chamber 10, and then the substrates are transferred out of the process chamber. Otherwise, after the first silicon oxide film formation step is carried out in a first process chamber, water vapor and dew in the first process chamber are removed out of the first process chamber, then, the substrates are transferred out of the first process chamber and transferred into a second process chamber, the second silicon oxide film formation step is carried out in the second process chamber, water vapor and dew in the second process chamber are removed out of the second process chamber, and then the substrates are transferred out of the second process chamber. In these cases, the formed silicon oxide film may be heat-treated. That is, after water vapor and dew in the process chamber 10 are removed out of the process chamber, the atmosphere in the process chamber 10 is replaced with an inert gas atmosphere containing halogen element (for example, nitrogen gas atmosphere containing 0.1% by volume of hydrogen chloride and having a temperature of 800° C., in which hydrogen chloride gas: 10 SCCM/nitrogen gas: 10 SLM), whereby the formed silicon oxide films are heat-treated, for example, for 30 minutes, then, the elevator unit 23 is operated to move the substrate receiving member 24 downwardly, and then the silicon semiconductor substrates 50 are transferred out of the substrate transfer portion 20. Otherwise, after the surface of the silicon layer is thermally oxidized in the process chamber 10, the formed silicon oxide films may be heat-treated as follows. The silicon semiconductor substrates 50 as substrates are transferred out of the process chamber 10, the substrate are transferred into the process chamber 10A of the heat treatment apparatus which is schematically shown in FIG. 8. A nitrogen gas atmosphere having a temperature of 700° C. is provided in the process chamber 10A in advance. After completion of the transfer of the silicon semiconductor substrates 50 into the process chamber 10A, the ambient temperature in the process chamber 10A is increased up to 800° C. at a rate of 5° C./minute, and then, the atmosphere in the process chamber 10A is replaced with an inert gas atmosphere containing halogen element (for example, nitrogen gas atmosphere containing 0.1% by volume of hydrogen chloride and having a temperature of 800° C., in which hydrogen chloride gas: 10 SCCM/nitrogen gas: 10 SLM), to heat-treat the formed silicon oxide films for 30 minutes.

The present invention has been explained with reference to preferred embodiments hereinabove, while the present invention shall not be limited thereto. Various conditions and structures of the apparatus for forming a silicon oxide film, explained in Examples, are given for explanative purposes and may be modified as required. The formation of a silicon oxide film is not limited to the pyrogenic method alone, and it may be carried out (A) by an oxidation method using water vapor generated by heating pure water, (B) by an oxidation method using water vapor generated by bubbling hot pure water with oxygen gas or inert gas, (C) by an oxidation method using water vapor generated by a reaction between hydrogen gas and oxygen gas in the presence of a catalyst, (D) by an oxidation method using water vapor generated by a reaction between oxygen plasma and hydrogen plasma, or a method which is a combination thereof. In some cases, the surface of the silicon layer may be thermally oxidized with a gas mixture of dry oxygen and hydrogen chloride or a gas mixture of dry oxygen and dichloroethylene.

When water vapor is generated by a reaction between hydrogen gas and oxygen gas in the presence of a catalyst, the catalyst is selected from Ni catalysts such as NiO, Pt catalysts such as Pt and $PtO_2$, Pd catalysts such as Pd and PdO, Ir catalysts, Ru catalysts such as Ru and $RuO_2$, Ag catalysts such as Ag and $Ag_2O$, Au catalysts, Cu catalysts such as CuO, Mn catalysts such as $MnO_2$, and Co catalysts such as $Co_3O_4$. A catalyst is placed inside the water vapor generating apparatus and heated to a predetermined temperature with a heater disposed inside the water vapor generating apparatus, and the water vapor generating apparatus is supplied with hydrogen gas and oxygen gas (and inert gas as required) through pipings, whereby the water vapor can be generated by a reaction between hydrogen gas and oxygen gas.

In the oxidation method using water vapor 30 generated by a reaction between oxygen plasma and hydrogen plasma, oxygen plasma generated by micro wave discharging is excited, by electron collision, from $O_2(X^3\Sigma g^-)$ in a ground state to $O_2\ (A^3\Sigma u^+)$ or $O_2\ (B^3\Sigma u^-)$ in an excited state, and these are dissociated to oxygen atoms as shown by the following expressions.

  (1-1)

  (1-2)

  (1-3)

  (1-4)

Therefore, oxygen plasma contains excited oxygen molecules and oxygen atoms, which work as reactant species. When hydrogen $H_2$ is introduced thereinto, following plasma is generated.

  (2)

of the oxygen plasmas, oxygen plasma generated, for example, as shown by Expression (1-2) and hydrogen plasma generated as shown by Expression (2) react with each other to generate water vapor. A heated surface of a silicon layer is thermally oxidized with the above water vapor to form a silicon oxide film thereon.

  (3)

Figure 19:
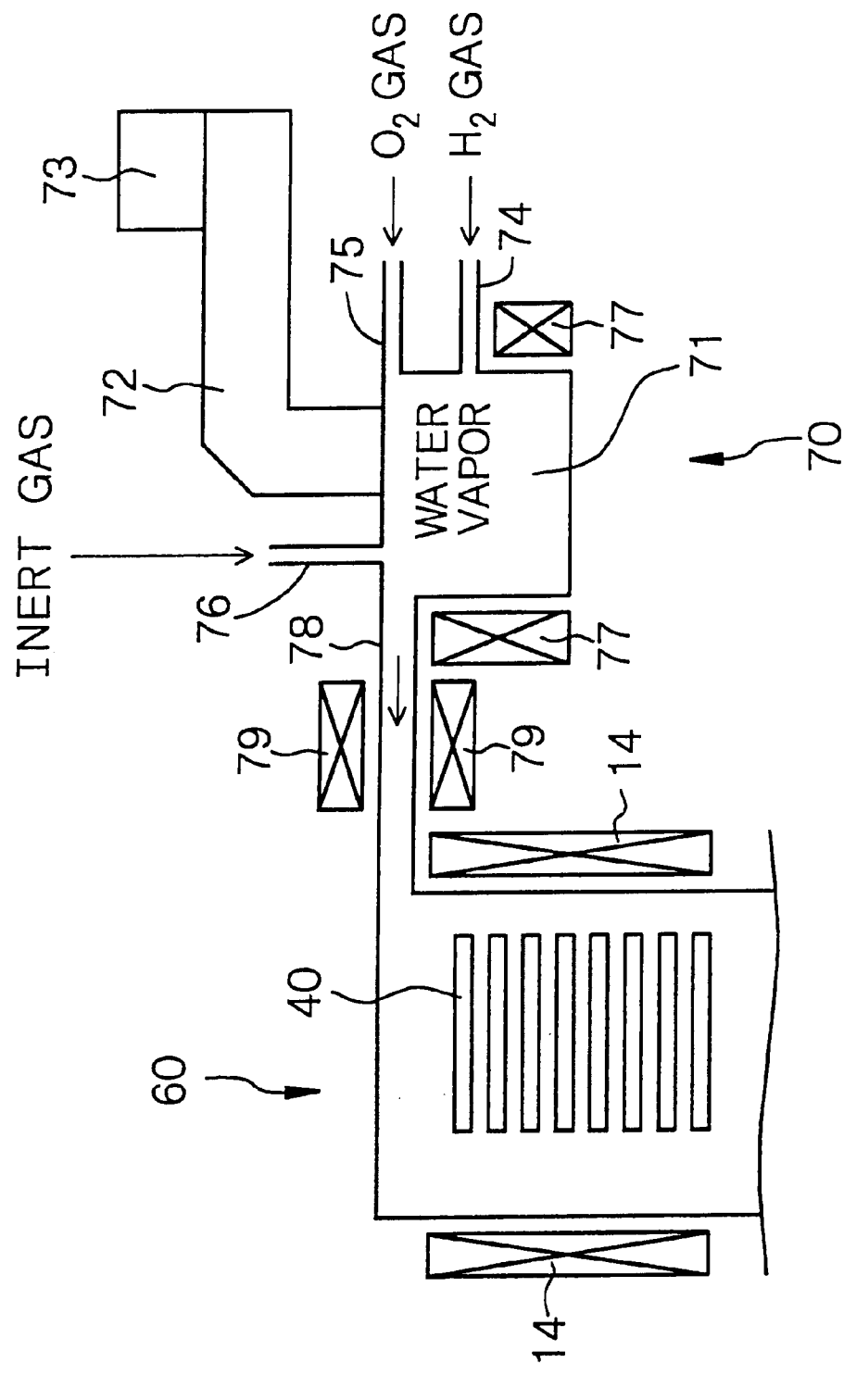
FIG. 19 is a conceptual view of an apparatus for forming a silicon oxide film on the basis of an oxidation method using water vapor generated by a reaction between oxygen plasma and hydrogen plasma.

FIG. 19 shows a conceptual view of an apparatus for forming a silicon oxide film by the oxidation method using water vapor generated by a reaction between oxygen plasma and hydrogen plasma. The apparatus comprises a process chamber 60 and a water vapor generating apparatus 70. The water vapor generating apparatus 70 comprises a water vapor generating chamber 71 made of quartz, a microwave waveguide 72 and a magnetron 73 attached to the microwave waveguide 72. The magnetron 73 generates microwaves having a frequency of 2.45 GHz. The microwaves are introduced into the water vapor generating chamber 71 through the microwave waveguide 72. Hydrogen gas and oxygen gas are introduced into the water vapor generating chamber 71 through pipings 74 and 75. The hydrogen gas and the oxygen gas introduced into the water vapor generating chamber 71 are irradiated with microwaves (electromagnetic waves), whereby the reactions shown by Expressions (1-1) to (1-4) and (2) proceed to generate oxygen plasma and hydrogen plasma. As a result of the reaction as shown by Expression (3), the water vapor is generated. A heater 77 is disposed outside the water vapor generating chamber 71, and an atmosphere inside the water vapor generating chamber 71 is maintained at a predetermined temperature (for example, 200 to 300° C.). The water vapor generated in the water vapor generating chamber 71 is introduced into the process chamber 60 through a piping 78. Preferably, a heater 79 is disposed outside the piping 78 to prevent dew formation in the piping 78, and an atmosphere inside the piping 78 is maintained at 200 to 300° C. Further, the water vapor generating chamber 71 is provided with a piping 76 for introducing inert gas (for example, nitrogen gas) into the water vapor generating chamber 71. In the process chamber 60, only some components of which are shown in FIG. 19, the heater 14, etc., can be structured so as to have structures of those of the apparatus for forming a silicon oxide film, shown in FIG. 1, 9, 10 or 15. In the process chamber 60, a silicon oxide film can be formed on each of the surfaces of the silicon semiconductor substrates 50.

Further, for example, in [Step-450] in Example 4, the atmosphere in the process chamber 10 of the apparatus for forming a silicon oxide film is temperature-increased, with the heater 14, up to an ambient temperature employed for carrying out the second silicon oxide film formation step while inert gas (for example, nitrogen gas) is introduced into the process chamber 10 through the water vapor inlet port 12. Instead thereof, for example, while inert gas (for example, nitrogen gas) containing 0.1% by volume of hydrogen chloride gas is introduced into the process chamber 10 through the water vapor inlet port 12, the ambient temperature in the process chamber 10 may be increased, with the heater 14, up to the ambient temperature employed for carrying out the second silicon oxide film formation step.

Further, when the heat treatment is carried out, the ambient temperature in the process chamber 10 is temperature-increased, with the heater 14, up to the ambient temperature employed for carrying out the heat treatment while inert gas (for example, nitrogen gas) is introduced into the process chamber 10 through the water vapor inlet port 12. Instead thereof, for example, while inert gas (for example, nitrogen gas) containing 0.1% by volume of hydrogen chloride gas is introduced into the process chamber 10 through the water vapor inlet port 12, the ambient temperature in the process chamber 10 may be temperature-increased, with the heater 14, up to the ambient temperature for carrying out the heat treatment.

In Examples, mostly, the silicon oxide film is formed on the surface of the silicon semiconductor substrate or the silicon oxide film is formed on the surface of the epitaxial silicon layer formed on the substrate. In a step of producing a semiconductor device, a silicon oxide film may be formed on the surface of a polycrystalline silicon layer, an amorphous silicon layer or the like formed on an insulation layer formed on a substrate. Otherwise, a silicon oxide film may be formed on a silicon layer of an SOI structure, a silicon oxide film may be formed on a surface of a substrate in or on which a semiconductor device or an elements for a semiconductor device is formed, or a silicon oxide film may be formed on a surface of a silicon layer formed on a substrate in or on which a semiconductor device or an elements for a semiconductor device is formed. The term "silicon layer" in the present specification includes a compound crystal layer of silicon and germanium.

Figure 20:
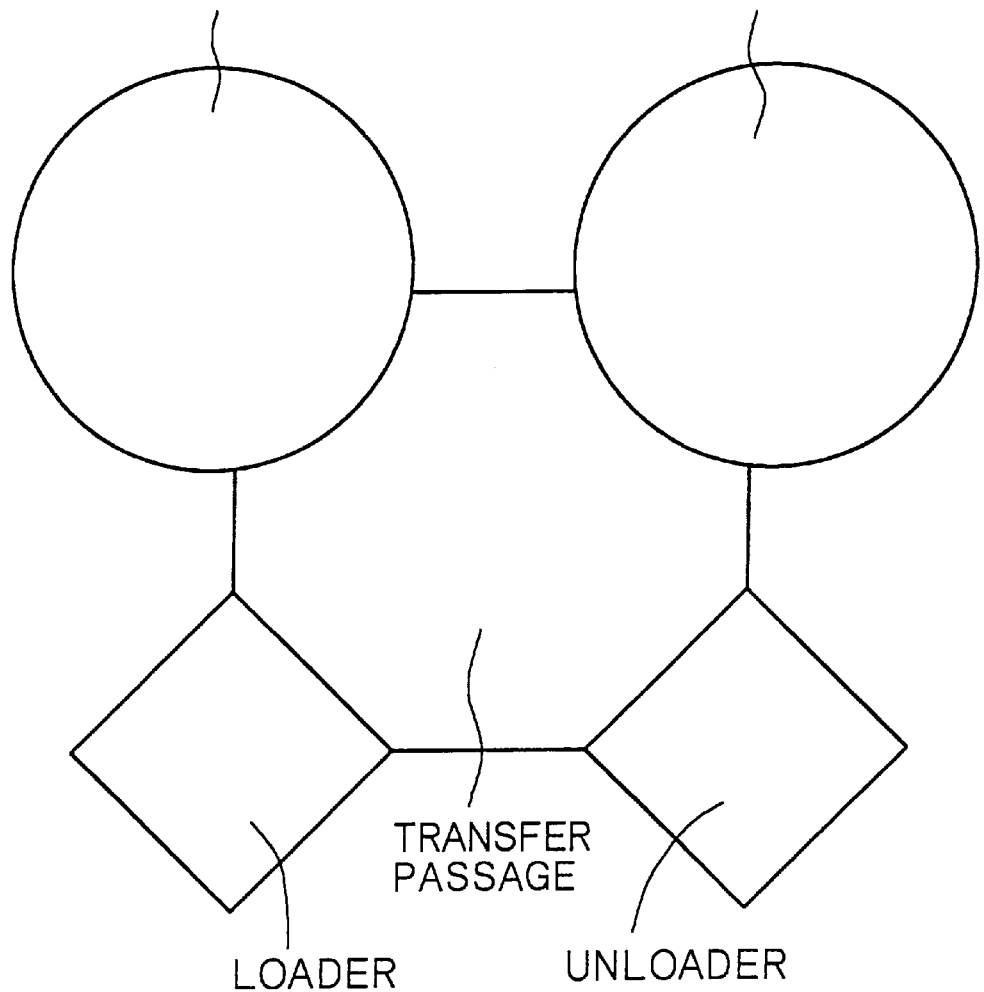
FIG. 20 is a schematic view of a cluster tool unit.

In Examples, the silicon semiconductor substrates 50 are surface-cleaned with a 0.1% hydrofluoric acid aqueous solution and then transferred into the apparatus for a silicon oxide film, while inert gas (for example, nitrogen gas) atmosphere may be an atmosphere employed from the surface-cleaning of the silicon semiconductor substrates 50 to the transfer thereof into the apparatus for forming a silicon oxide film. The above atmosphere can be provided, for example, by a method in which an inert gas atmosphere is employed as an atmosphere in a surface cleaning apparatus for cleaning a surface of a silicon semiconductor substrate and the silicon semiconductor substrate 50 is encased in a transfer box filled with inert gas and transferred into the substrate transfer portion 20 of the apparatus for forming a silicon oxide film, or by a method in which a cluster tool unit comprising a surface cleaning apparatus, an apparatus for forming a silicon oxide film, a transfer passage, a loader and an unloader as shown in FIG. 20 is used, the transfer passage connects from the surface cleaning apparatus to the substrate transfer portion 20 of the apparatus for forming a silicon oxide film and an inert gas atmosphere is provided as an atmosphere in each of the surface cleaning apparatus and the transfer passage.

Otherwise, instead of surface-cleaning the silicon semiconductor substrates 50 with a 0.1% hydrofluoric acid aqueous solution, the silicon semiconductor substrate 50 may be surface-cleaned by a gaseous phase cleaning method using anhydrous hydrogen fluoride gas under conditions shown in Table 1. For preventing the occurrence of particles, methanol is added. Otherwise, the silicon semiconductor substrate 50 may be surface-cleaned by a gaseous phase cleaning method using hydrogen chloride under conditions shown in Table 2. Before or after the surface cleaning of the silicon semiconductor substrate 50, the atmosphere in the surface cleaning apparatus or the atmosphere in the transfer passage may be an inert gas atmosphere or a vacuum atmosphere having a vacuum degree of, for example, 1.3× $10^{-1}$ Pa ($10^{-3}$ Torr). When a vacuum atmosphere is employed as an atmosphere in the transfer passage, etc., a vacuum atmosphere having a vacuum degree of, for example, 1.3×$10^{-1}$ Pa ($10^{-3}$ Torr) may be provided as an atmosphere in the substrate transfer portion 20 of the apparatus before and during the transfer of the silicon semiconductor substrates, and after completion of the transfer of the silicon semiconductor substrates into the substrate transfer portion 20, inert gas (for example, nitrogen gas) atmosphere having an atmospheric pressure may be provided in the substrate transfer portion 20. In this manner, the surface of the silicon layer terminated with hydrogen and fluoride before the formation of the silicon oxide film can be maintained in a state free of pollution and the like. As a result, there can be effectively prevented the inclusion of water, organic substances or Si—OH in the formed silicon oxide film which inclusion results in the downgrading of the formed silicon oxide film and the occurrence of defective portions.

TABLE 1

| Anhydrous hydrogen fluoride gas | 300 SCCM |
| Vaporized methanol | 80 SCCM |
| Nitrogen gas | 1000 SCCM |
| Pressure | 0.3 Pa |
| Temperature | 60° C. |

TABLE 2

| Hydrogen chloride gas/nitrogen gas | 1% by volume |
| Temperature | 800° C. |

In the present invention, a metal member of the apparatus for forming a silicon oxide film is not corroded with water, and the problem of in-plane non-uniformity of the silicon oxide film, caused by stains similar to water marks on the surface of the silicon semiconductor substrate, can be reliably prevented. Therefore, thermal oxidation with water vapor can be carried out at a lower temperature than in conventional methods, and very thin silicon oxide films having a thickness of, for example, 1–2 nm each can be formed uniformly with good reproducibility without any in-plane deviation or any deviation among the silicon oxide films. Particularly, when the silicon oxide films are heat-treated in the process chamber followed by thermal oxidation of the formed silicon oxide films by providing an inert gas atmosphere containing halogen element in the process chamber, there can be reliably prevented a phenomenon of, for example, hydrochloric acid being formed in the process chamber.

What is claimed is:

1. A method of forming a silicon oxide film, which comprises the step of:

thermally oxidizing a surface of a silicon layer of a substrate in a process chamber of an apparatus by introducing water into the process chamber;

preventing dew formation in the process chamber, and evaporating any dew previously existing in the process chamber using a dew prevention/evaporation means;

replacing an atmosphere in the process chamber with inert gas in a state where no water vapor is formed in the process chamber; and transferring the substrate out of the process chamber.

2. The method of claim 1, wherein the apparatus further has:

(a) a water vapor generating apparatus, (b) a water vapor inlet port disposed in an upper portion of the process chamber, for introducing water vapor into the process chamber, for introducing water vapor into the process chamber, (c) a gas exhaust portion disposed in lower portion of the process chamber, for exhausting gas from the process chamber, (d) a substrate transfer portion disposed below the process chamber and allowed to be communicated with the process, (e) a substrate receiving unit composed of a substrate receiving member for receiving a plurality of substrates having silicon layers, and heat insulation member disposed on the bottom of the substrate receiving member.

(f) an elevator unit for elevating the substrate receiving unit upwardly and downwardly to transfer the substrate receiving unit from the substrate transfer portion to the process chamber and form the process chamber to the substrate transfer portion, and (g) a heater unit disposed outside the process chamber for heating the silicon layer, wherein the dew-formation prevention/evaporation means is for preventing dew formation on the surface of the heat insulation member and evaporating dew on the surface of the heat insulation member.

3. The method of claim 2, wherein a surface temperature of the heat insulation member is controlled in a range from 100° C. to 150° C. by the dew-formation prevention/evaporation means.

4. The method of claim 2, wherein the dew-formation prevention/evaporation means comprises an inert gas source, an inert gas inlet port disposed in the process chamber, a piping connecting the inert gas inlet portion and the inert gas source, and heating means for heating the inert gas to be introduced into the process chamber.

5. The method of claim 4, wherein the inert gas inlet portion is arranged in the process chamber to allow flow of the inert gas introduced into the process chamber to collide with the heat insulation member.

6. The method of claim 4, wherein the dew-formation prevention/evaporation means further comprises means for measuring a moisture content of the gas exhausted from the gas exhaust portion, and after the moisture content of the gas exhausted from the gas exhaust portion comes to be equal at most a predetermined value, the substrates are transferred out of the process chamber.

7. The method of claim 2, wherein the dew-formation prevention/evaporation means comprises an auxiliary heating unit which is disposed outside the process chamber and heats the heat insulation member.

8. The method of claim 7, wherein the dew-formation prevention/evaporation means further comprises temperature detecting means for detecting a surface temperature of the heat insulation member and a control unit for controlling the auxiliary heating unit.

9. The method of claim 8, wherein the auxiliary heating unit is a heater.

10. The method of claim 8, wherein the auxiliary heating unit comprises a piping and a hot medium flowing in the piping.

11. The method of claim 1, wherein the water vapor to be introduced into the process chamber is generated by one of the following steps (A) reacting hydrogen gas and oxygen gas at a high temperature, (B) heating pure water, (C) bubbling hot pure water with oxygen gas or inert gas, (D) reacting hydrogen gas and oxygen gas in the presence of a catalyst, or (E) a reaction between oxygen plasma and hydrogen plasma.

12. The method of claim 1, wherein the surface of the silicon layer is thermally oxidized in the process chamber, then, the atmosphere in the process chamber is replaced with inert gas in a state where no dew is formed in the process chamber and/or dew in the process chamber is evaporated, to remove water vapor out of the process chamber, then, an inert gas atmosphere containing halogen element is provided in the process chamber to heat-treat the formed silicon oxide film, and then, the substrate is transferred out of the process chamber.

13. The method of claim 1, wherein the substrate transferred out of the apparatus for forming a silicon oxide film is transferred into a heat treatment apparatus and an inert gas atmosphere containing halogen element is provided in the heat treatment apparatus to heat-treat a formed silicon oxide film.

14. A method of forming a silicon oxide film, which comprises the steps of:

transferring a substrate having a silicon layer into a process chamber;

introducing water vapor into the process chamber to thermally oxidize a surface of the silicon layer;

replacing an atmosphere in the process chamber with an inert gas atmosphere to remove the water vapor and/or dew out of the process chambers; and transferring the substrate out of the process chamber.

15. The method of claim 14, wherein an ambient temperature of the process chamber for the thermal oxidation of the surface of the silicon layer and an ambient temperature of the process chamber during the removal of the water vapor and/or dew out of the process chamber are nearly equal to each other.

16. The method of claim 15, wherein the ambient temperature of the process chamber for the thermal oxidation of the surface of the silicon layer is 750° C. or lower.

17. The method of claim 14, wherein the inert gas exhausted out of the process chamber is measured for a moisture content when the water vapor and/or dew are removed out of the process chamber, and after the moisture content of the inert gas exhausted out of the process chamber comes to be equal to, or lower than, a predetermined value, the substrate is transferred out of the process chamber.

18. The method of claim 17, wherein the predetermined value is 0.02 kg per kilogram of dry inert gas.

19. The method of claim 14, wherein the water vapor and/or dew in the process chamber are removed out of the process chamber, then, an inert gas atmosphere containing halogen element is provided in the process chamber to heat-treat the formed silicon oxide film, and then the substrate is transferred out of the process chamber.

20. The method of claim 14, wherein the substrate transferred out of the process chamber is transferred into a heat treatment apparatus, and an inert gas atmosphere containing halogen element is provided in the heat treatment apparatus to heat-treat the formed silicon oxide film.

21. A method of forming a silicon oxide film using apparatus having a process chamber and drw-formation prevention/evaporation means, comprising the steps of: transferring a substrate having a silicon layer into the process chamber;

introducing water vapor into the process chamber to thermally oxidize a surface of the silicon layer; thermally oxidizing the surface of the silicon layer in the process chamber; replacing an atmosphere in the process chamber with inert gas in a state such that no water vapor is formed in the process chamber; and all drw in the process chamber is evaporated; preventing drew formation in the process chamber; evaporating dew formation in the process chamber; removing water vapor out of the process chamber; and transferring the substrate out of the process chamber.

* * * * *

UNITED STATES PATENT AND TRADEMARK OFFICE
CERTIFICATE OF CORRECTION

PATENT NO.    : 6,239,044 B1
DATED         : May 29, 2001
INVENTOR(S)   : Akihide Kashiwagi et al.

It is certified that error appears in the above-identified patent and that said Letters Patent is hereby corrected as shown below:

Column 32,
Lines 60-61, delete the second occurrence of "for introducing water vapor into the process chamber,".
Line 67, insert the word -- chamber -- after the word "process".

Column 33,
Line 3, insert the word -- a -- after the word "and" and before the word "heat".
Line 4, replace "." with -- , --.
Line 36, insert --to, or lower than, -- after "equal" and before "at most".
Line 55, insert -- : -- immediately after the word "steps".

Column 34,
Line 51, replace "drw" with -- dew --.
Line 60, replace ";" with -- , -- and replace "drw" with -- dew --.
Line 61, replace "drew" with -- dew --.

Signed and Sealed this

Fifth Day of August, 2003

JAMES E. ROGAN
*Director of the United States Patent and Trademark Office*